United States Patent
Xiang

(10) Patent No.: US 11,955,891 B2
(45) Date of Patent: Apr. 9, 2024

(54) PACKAGED MODULE AND METAL PLATE

(71) Applicant: Huawei Digital Power Technologies Co., Ltd., Shenzhen (CN)

(72) Inventor: Zhiqiang Xiang, Dongguan (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 304 days.

(21) Appl. No.: 17/367,895

(22) Filed: Jul. 6, 2021

(65) Prior Publication Data

US 2021/0343663 A1 Nov. 4, 2021

Related U.S. Application Data

(63) Continuation of application No. PCT/CN2020/095962, filed on Jun. 12, 2020.

(30) Foreign Application Priority Data

Jun. 14, 2019 (CN) .......................... 201910516626.0

(51) Int. Cl.
*H01L 23/495* (2006.01)
*H01F 27/29* (2006.01)
(Continued)

(52) U.S. Cl.
CPC .... *H02M 3/1584* (2013.01); *H01L 23/49555* (2013.01); *H01L 23/49568* (2013.01);
(Continued)

(58) Field of Classification Search
CPC ......... H01L 23/49568; H01L 23/49575; H01L 23/49555; H01L 23/645; H01L 23/64;
(Continued)

(56) References Cited

U.S. PATENT DOCUMENTS

| | | | | |
|---|---|---|---|---|
| 5,294,826 A | * | 3/1994 | Marcantonio | ....... H01L 23/4334 257/E23.128 |
| 2012/0112332 A1 | * | 5/2012 | Minamio | .......... H01L 23/49575 438/122 |

(Continued)

FOREIGN PATENT DOCUMENTS

| | | |
|---|---|---|
| CN | 102790513 A | 11/2012 |
| CN | 102870175 A | 1/2013 |

(Continued)

*Primary Examiner* — Omar F Mojaddedi
(74) *Attorney, Agent, or Firm* — Maier & Maier, PLLC

(57) ABSTRACT

A packaged module and a metal plate. The packaged module may include a bearing structure, at least one metal strip, a circuit element, and a magnetic material. Further, a first surface of the bearing structure may bear the circuit element; two ends of each of the at least one metal strip may be coupled to the bearing structure, and a part of each metal strip other than the two ends is spaced apart from the bearing structure; and the magnetic material may cover a surface of a winding functional region of the at least one metal strip, where the winding functional region may be a part or all of the metal strip to which the winding functional region belongs. The foregoing solution helps simplify a packaging process and reduce losses and manufacturing costs of the packaged module.

15 Claims, 35 Drawing Sheets

(51) Int. Cl.
*H01L 23/13* (2006.01)
*H01L 23/64* (2006.01)
*H01L 25/07* (2006.01)
*H01L 25/16* (2023.01)
*H01L 49/02* (2006.01)
*H02M 3/00* (2006.01)
*H02M 3/158* (2006.01)

(52) U.S. Cl.
CPC ...... *H01L 23/49575* (2013.01); *H01L 23/645* (2013.01); *H01L 25/16* (2013.01); *H01L 28/10* (2013.01); *H02M 3/003* (2021.05)

(58) Field of Classification Search
CPC ..... H01L 25/50; H01L 25/165; H01L 25/072; H01L 25/00; H01L 28/10; H01L 23/13; H01L 23/14; H01F 27/292; H01F 27/22; H02M 3/003; H02M 3/1584
See application file for complete search history.

(56) References Cited

U.S. PATENT DOCUMENTS

| | | | |
|---|---|---|---|
| 2013/0077250 | A1 | 3/2013 | Herbsommer et al. |
| 2014/0266546 | A1 | 9/2014 | Mao |
| 2017/0338171 | A1* | 11/2017 | Cho .................. H01L 23/49534 |
| 2018/0190573 | A1* | 7/2018 | Mullenix .............. H01L 23/645 |
| 2019/0386061 | A1* | 12/2019 | Liu ....................... H01L 23/552 |
| 2020/0258819 | A1* | 8/2020 | Ko ..................... H01L 23/49531 |

FOREIGN PATENT DOCUMENTS

| | | |
|---|---|---|
| CN | 103715181 A | 4/2014 |
| CN | 203691210 U | 7/2014 |
| CN | 107221519 A | 9/2017 |
| CN | 107403794 A | 11/2017 |
| CN | 108990362 A | 12/2018 |
| JP | 2012234986 A | 11/2012 |
| WO | 2018126155 A1 | 7/2018 |

* cited by examiner

PACKAGED MODULE AND METAL PLATE

CROSS-REFERENCE TO RELATED APPLICATIONS

This application is a continuation of International Application No. PCT/CN2020/095962, filed on Jun. 12, 2020, which claims priority to Chinese Patent Application No. 201910516626.0, filed on Jun. 14, 2019. The disclosures of the aforementioned applications are hereby incorporated by reference in their entireties.

TECHNICAL FIELD

The embodiments relate to the field of electronic science and technologies, and in particular, to a packaged module and a metal plate.

BACKGROUND

A power module is a common component in a terminal device, with functions such as voltage regulation and power switch. The power module mainly includes components such as a metal frame, a discrete element, and a magnetic element.

Currently, a power supply in package (PSiP) is a main development trend of power module packaging technologies. In a PSiP-packaged power module, the metal frame bears a circuit element, and a magnetic element is disposed over the circuit element. The magnetic element includes a coil winding, two magnetic cores, and four pins welded to the coil winding. The two magnetic cores wrap the coil winding in pairs, so that the magnetic element can implement a function of inductance. The four pins of the magnetic element form a stand structure. When the four pins are welded on a surface of the metal frame, the coil winding and the magnetic cores on both sides of the coil winding can be erected over the circuit element.

However, an existing PSiP-packaged power module packaging process is relatively complex, and the power module has relatively large losses and relatively high costs.

SUMMARY

In view of this, the embodiments provide a packaged module and a metal plate, to simplify a packaging process and reduce losses and manufacturing costs of the packaged module.

According to a first aspect, an embodiment provides a packaged module, where the packaged module may include a bearing structure, at least one metal strip, a circuit element, and a magnetic material. A first surface of the bearing structure may bear the circuit element; two ends of each of the at least one metal strip may be coupled to the bearing structure, and a part of each metal strip other than the two ends is spaced apart from the bearing structure; and the magnetic material may cover a surface of a winding functional region of the at least one metal strip, where the winding functional region may be a part or all of the metal strip to which the winding functional region belongs.

For example, the metal strip may be a cylindrical strip, a thin sheet strip, or the like. The winding functional region of the metal strip may be a part or all of the metal strip. That the magnetic material covers the winding functional area may also be understood as that the metal strip is at least partially covered by the magnetic material, so that a closed magnetic field can be formed around at least a part of the metal strip. The bearing structure may be a metal frame or a PCB type substrate with an IC line. Two ends of the metal strip are coupled to the bearing structure, and a part of the metal strip other than the two ends is spaced apart from the bearing structure, so that the metal strip and the bearing structure can form a loop. When a current flows through the metal strip, an electromagnetic field generated by the metal strip can be inducted with the magnetic field of the magnetic material, thereby implementing a function of an inductance element.

For example, for any one of the at least one metal strip, such as a first metal strip, the first metal strip is coupled to the bearing structure in at least three possible manners below: two ends of the first metal strip are coupled to the first surface of the bearing structure; or sides of two ends of the first metal strip are coupled to a side of the bearing structure; or a side of one end of the first metal strip is coupled to a side of the bearing structure, and the other end of the first metal strip is coupled to the first surface of the bearing structure.

The coupling manners between the metal strip and the bearing structure may be soldering, integrally forming, and the like. Compared with a current coupling manner in which a magnetic element is welded onto a metal frame by using four pins, the metal strip in the packaged module provided in this embodiment may be directly coupled to the bearing structure. This helps reduce losses caused by coupling and reduce overall losses of the packaged module.

Moreover, in this embodiment, the function of the inductance element can be implemented by the metal strip and the magnetic material, with no need to prepare the magnetic element in advance. This helps simplify a packaging process and reduce manufacturing costs of the packaged module.

In a possible implementation, the at least one metal strip includes a first metal strip, where the first metal strip may be a bending structure, the first metal strip may include: a first supporting part and a second supporting part that are located at two ends of the first metal strip, and a first stacking part located between the first supporting part and the second supporting part; and the circuit element in the packaged module may be located between the first stacking part and the first surface of the bearing structure.

For example, the first metal strip may be any one of the at least one metal strip. It may be understood that each of the at least one metal strip of the packaged module may use an implementation of the first metal strip. Because the first metal strip has the bending structure, the first stacking part thereof can be stacked with the circuit element in a direction perpendicular to the first surface, so as to implement a 3D stacking structure. This helps reduce a footprint of the packaged module.

For example, the first stacking part may alternatively be parallel to the first surface of the bearing structure.

For example, a surface of the first stacking part may also be exposed to an outer surface of the packaged module. Because the first metal strip is made of metal, the first metal strip has relatively high thermal conductivity. A surface of the first stacking part is exposed to the outer surface of the packaged module, so that heat generated inside the packaged module can be dissipated from the surface of the first stacking part to outside of the packaged module when the packaged module is working, thereby helping improve heat dissipation performance of the packaged module.

In a possible implementation, the packaged module may include a plurality of metal strips, to help improve performance of the packaged module and also make the packaged module adapt to more complex circuit designs.

In an example, the at least one metal strip of the packaged module includes a first metal strip and a second metal strip. The two ends of the first metal strip and two ends of the second metal strip are all coupled to a same side of the bearing structure; and the two ends of the second metal strip may be located between the two ends of the first metal strip.

In another example, the at least one metal strip of the packaged module includes a first metal strip and a third metal strip. The two ends of the first metal strip are coupled to a first side of the bearing structure; and two ends of the third metal strip are coupled to a second side of the bearing structure.

In a possible implementation, the packaged module may further include a heat dissipation plate. The heat dissipation plate may be a bending structure, including a third supporting part and a second stacking part, where one side of the third supporting part may be coupled to a side of the first stacking part of the metal strip, or a side of the bearing structure, or the first surface of the bearing structure. The second stacking part is parallel to the first surface of the bearing structure, a distance between the second stacking part and the first surface of the bearing structure is greater than a distance between the first stacking part of the metal strip and the first surface of the bearing structure, and a surface of the second stacking part is exposed to an outer surface of the packaged module.

For example, the heat dissipation plate may be made of a material with high thermal conductivity, such as metal. In a working process of the packaged module, the heat dissipation plate may dissipate the heat generated inside the packaged module to the outside of the packaged module, thereby helping improve the heat dissipation performance of the packaged module.

In a possible implementation, the two ends of the first metal strip and one side of the third supporting part in the packaged module may be coupled to a same side of the bearing structure, and one side of the third supporting part may also be located between the two ends of the first metal strip.

In a possible implementation, the packaged module may be filled with the magnetic material, and at least one outer surface of the packaged module includes the magnetic material.

For example, the magnetic material may be filled in space inside the packaged module except the at least one metal strip and the circuit element; or the packaged module may include a plastic package material, where the plastic packaging material covers the circuit element, and the magnetic material may be filled in other space inside the packaged module.

The magnetic material is filled in the packaged module, so that during manufacturing of the packaged module, the winding functional region of the metal strip can be covered with the magnetic material and the packaged module can be packaged. This further helps simplify a manufacturing process of the packaged module.

According to a second aspect, an embodiments may further provide a metal plate, and the metal plate may be configured to manufacture a packaged module. The metal plate may include at least one metal strip and a metal frame, where the metal frame may be configured to bear a circuit element in the packaged module, at least one end of each of the at least one metal strip is coupled to a side of the metal frame, and each metal strip may be configured to couple to a magnetic material in the packaged module.

For example, the metal plate provided in the second aspect of the embodiments may be configured to manufacture the packaged module provided in the first aspect. Because the at least one end of the metal strip in the metal plate is already coupled to the metal frame, with the metal plate provided in this embodiment, the step of coupling one end of the metal strip to the metal frame can be omitted for at least once. This helps simplify a manufacturing process of the packaged module.

For example, the at least one metal strip includes a first metal strip, and two ends of the first metal strip are coupled to a side of the metal frame. Therefore, during manufacturing of the packaged module, the step of coupling the two ends of the first metal strip to the metal frame is omitted, further simplifying the manufacturing process. Furthermore, two ends of each of the at least one metal strip may be coupled to a side of the metal frame, so that during manufacturing of the packaged module, the step of coupling the two ends of the metal strip to the metal frame is completely omitted.

In a possible implementation, the metal plate may include a plurality of metal strips, where the plurality of metal strips may be configured to manufacture a packaged module that includes a plurality of inductance elements.

In an example, the at least one metal strip of the metal plate may include a first metal strip and a second metal strip, the two ends of the first metal strip and two ends of the second metal strip are coupled to a same side of the bearing structure, and the two ends of the second metal strip are located between the two ends of the first metal strip.

In another example, the at least one metal strip of the metal plate includes a first metal strip and a third metal strip, the two ends of the first metal strip are coupled to a first side of the bearing structure, and two ends of the third metal strip are coupled to a second side of the bearing structure.

In a possible implementation, the metal plate provided in this embodiment may further include a heat dissipation plate; one side of the heat dissipation plate is coupled to a side of the metal frame or a side of the first metal strip. Manufacturing the packaged module by using the metal plate helps improve heat dissipation performance of the packaged module.

For example, the two ends of the first metal strip and one side of the heat dissipation plate in the metal plate may be coupled to a same side of the bearing structure, and a side of a third supporting part coupled to the metal frame may be located between the two ends of the metal strip.

In a possible implementation, at least one end of each of the at least one metal strip may be integrally formed with a side of the metal frame. The integrally-formed coupling manner hardly increases coupling losses, and helps reduce overall losses of the packaged module.

DETAILED DESCRIPTION OF THE EMBODIMENTS

Figure 1:
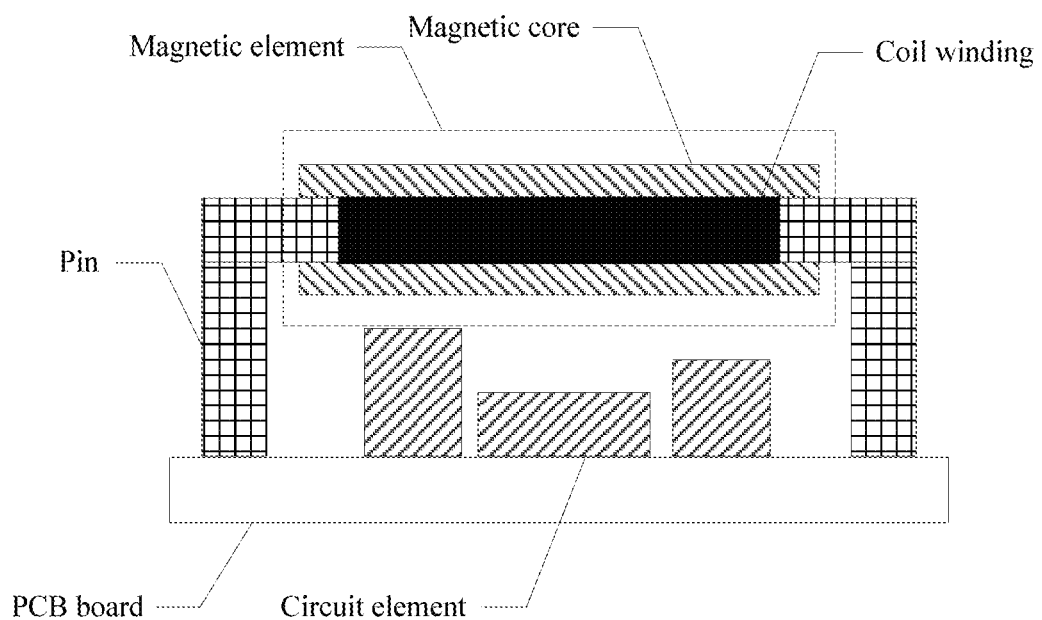
FIG. 1 is a cross-sectional view of a POL-packaged power module.

To make the objectives, solutions, and advantages of the embodiments clearer, the following further describes the embodiments in detail with reference to the accompanying drawings. The operation method in the method embodiments may also be applied to the apparatus embodiment or the system embodiment. It may be understood that in the embodiments, "at least one" means one or more, and "plurality" means two or more. In view of this, in the embodiments, "plurality" may also be understood as "at least two". The term "and/or" describes an association relationship for describing associated objects and represents that three relationships may exist. For example, A and/or B may represent the following three cases: Only A exists, both A and B exist, and only B exists. In addition, the character "/" generally indicates an "or" relationship between the associated objects. In addition, it may be understood that in the descriptions, terms such as "first" and "second" are merely intended for a purpose of distinguishing descriptions, and may be understood as not being an indication or implication of relative importance, nor as an indication or implication of a sequence.

For convenience, a spatially relative terminology system is used in the following description, and is not limiting. The words "top" and "bottom" indicate directions in the accompany drawings. The terms may include the words mentioned above, their derivatives, and similarly introduced words. "On . . . ", "above . . . ", "on the upper surface of . . . ", "on the top of . . . ", and the like are used to describe a spatial location relationship between a device or feature shown in the figure and another device or feature. It may be understood that the spatially relative terms are intended to include different orientations other than orientations of the devices described in the figure. For example, if a device in the drawing is turned upside down, the device described as "on the top of another device or structure" or "above another device or structure" is then positioned as "at the bottom of another device or structure" or "below another device or structure". Therefore, the example term "above" can include both orientations "above" and "below". The device may also be positioned in other different ways (rotated by 90 degrees or in other orientations), and the spatially relative description used herein is explained accordingly.

In the embodiments, coupling refers to transmission of energy from one circuit part to another circuit part. For example, A being coupled to B means that energy can be transferred between A and B. For example, A being coupled to B may mean that electric energy can be transferred between A and B. For example, A and B are directly electrically connected, or A and B are indirectly electrically connected through an intermediate conductor C. For another example, A being coupled to B may alternatively mean that magnetic field potential energy can be transferred between A and B. For example, A is a coil, and B is a magnetic core. A and B can be in direct contact or spaced some distance apart. However, after A is conducted, inductance is generated between an electromagnetic field of A and a magnetic field of B, so that potential energy of the magnetic field of B is transferred to A and converted into electric energy of A, thereby increasing inductance of A.

The following clearly describes the solutions in the embodiments with reference to the accompanying drawings in the embodiments.

A magnetic element is usually disposed in a modularized circuit such as a transformer module, an amplifier module, or a power module. The so-called modularized circuit is a circuit capable of implementing a function after being packaged. Using a power module as an example, the power module has functions such as controlling a power switch and adjusting an output voltage of a power supply. There may be two packaging forms for the power module: point of load (POL) package and PSiP.

FIG. 1 shows an example of a cross-sectional view of a POL-packaged power module. As shown in FIG. 1, the POL-packaged power module includes a printed circuit board (PCB), a circuit element, and a magnetic element that are stacked. An integrated circuit (IC) circuit is fabricated on one surface of the PCB board. The IC circuit may include structures such as a metal interconnect and a transistor. On the other surface of the PCB board, electrodes are fabricated for input and output of electrical signals in the POL-packaged module.

In addition, one or more circuit elements are soldered on the PCB board, and the circuit elements are coupled to IC lines on the PCB board. In this embodiment, the circuit elements are elements that constitute a circuit, for example, a chip, a capacitor, and a resistor, all of which may be used as the circuit elements coupled to the IC lines on the PCB board.

The magnetic element is disposed above the circuit element. The magnetic element is formed by one coil winding and two magnetic cores. The two magnetic cores are respectively arranged on upper and lower surfaces of the coil winding, and the two magnetic cores are buckled to surround the coil winding. The coil winding is supported above a discrete element by using four pins, and the four pins are coupled to the IC lines on the PCB.

Three-dimensional (3D) stacking can be implemented for the POL package, thereby helping reduce a footprint of the power module and miniaturize the power module.

Figure 2A:
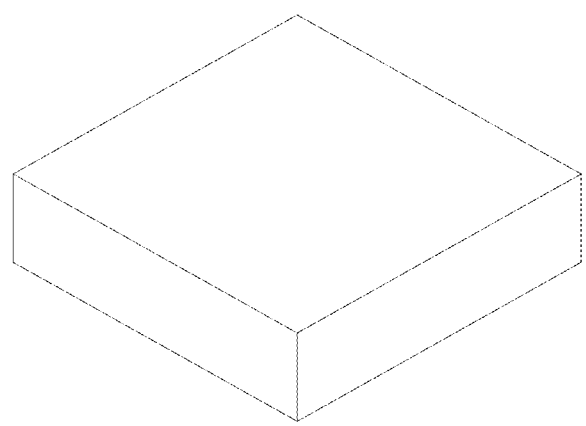
FIG. 2a is a schematic appearance diagram of a PSiP-packaged power module.

On the basis of the POL package, the PSiP package has been further developed. FIG. 2a shows an example of a schematic appearance diagram of a PSiP-packaged power module. It may be understood from FIG. 2a that the PSiP-packaged power module may be a regular hexahedron. An internal structure of the PSiP-packaged power module is similar to that in the POL package. A difference lies in that a metal frame in the PSiP-packaged power module replaces the PCB. The metal frame may be a hollow metal plate, as shown in FIG. 2c, where a white region is a hollow region in the metal frame and a black region is a metal region in the metal frame. A circuit element is borne on one surface of the metal frame. For the PSiP-packaged power module, a plastic material is filled in space of the power module except the circuit element and the magnetic element, and the plastic material forms an outer surface of the power module.

Figure 2B:
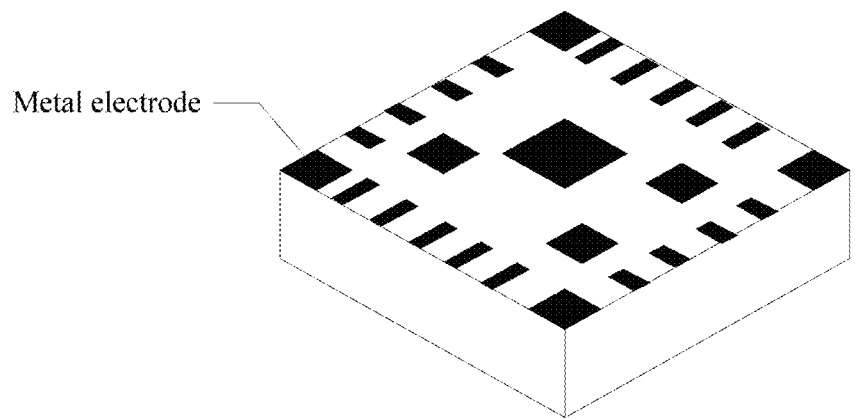
FIG. 2b is another schematic appearance diagram of a PSiP-packaged power module.
Figure 2C:
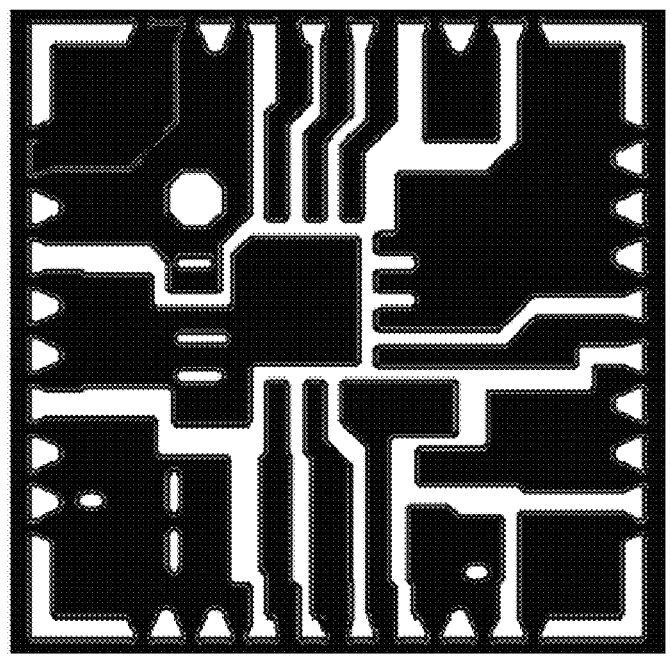
FIG. 2c is a schematic structural diagram of a metal frame.

As shown in FIG. 2b, in a plurality of outer surfaces of the power module, an outer surface close to the metal frame further includes a metal electrode, where the metal electrode may be used to input and output electrical signals of the power module. During assembly of an electronic device, the metal electrode shown in FIG. 2b may be soldered on a main board of the electronic device.

Figure 3:
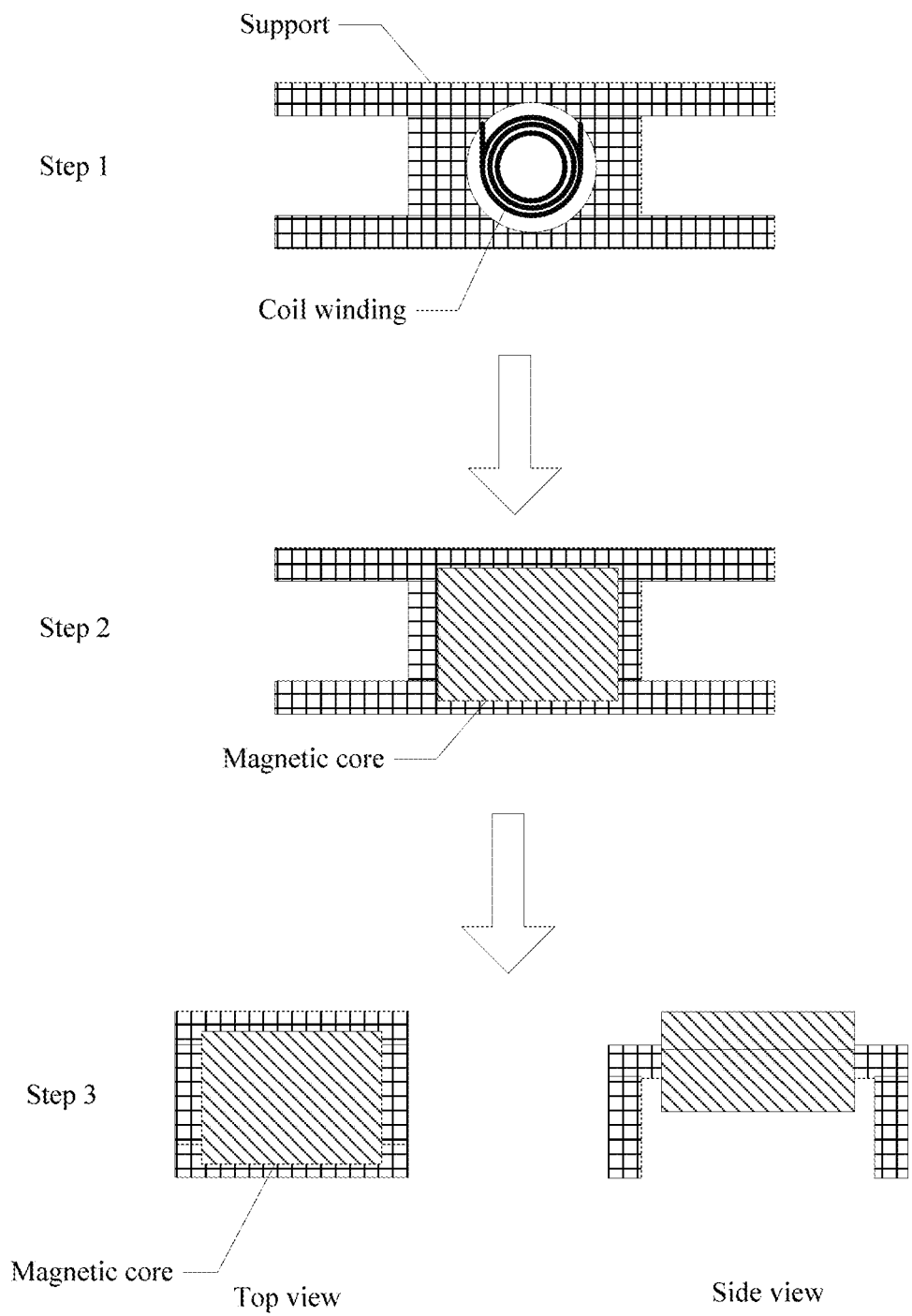
FIG. 3 is a schematic diagram of a preparation process of a magnetic element.

However, regardless of the POL package or the PSiP package, a packaging process is relatively complex, because a magnetic element including four pins needs to be prepared in advance, and then the magnetic element is soldered on the PCB board or the metal frame. FIG. 3 shows an example of a preparation process of the magnetic element, which may include the following steps:

Step 1: Solder a coil winding on a support with four pins, where the support is a plane structure made of metal.

Step 2: Assemble a magnetic core on a surface of the coil winding.

Step 3: Fold the four pins.

It may be learned from the preparation of the magnetic element that after the four pins of the magnetic element are soldered to the metal frame (or PCB board), there are at least two soldering positions between the coil winding and the metal frame (or PCB board), which increases a solder joint impedance of the power module. Therefore, this is not conducive to loss reduction for the power module.

Moreover, the POL and PSiP packaging forms require high dimensional accuracy of the magnetic element. For example, the four pins of the magnetic element need to match positions of solder joints reserved for the magnetic element on the metal frame (or PCB board). For another example, the four pins of the magnetic element need to have a high degree of coplanarity, so that all the four pins can be soldered on the metal frame (or PCB board) to reduce a phenomenon of pseudo soldering. Therefore, after step 3, the coplanarity of the four pins usually needs to be further checked. The high requirement on the dimensional accuracy of the magnetic element increases incoming material costs and inspection processes of the magnetic element, which is not conducive to reducing manufacturing costs of the power module.

To sum up, a current packaging technology of a circuit module still needs further study. In view of this, an embodiment provides a packaged module (which can be understood as a packaged circuit module), including a bearing structure, a metal strip, a circuit element, and a magnetic material. The bearing structure may be a metal frame or a PCB type substrate with an IC line. For ease of description, this embodiment is described by using a metal frame as an example below.

In the packaged module, a first surface of the metal frame bears the circuit element, two ends of the metal strip are coupled to the metal frame to form a loop, and the magnetic material covers a surface of a winding functional region of the metal strip. In this embodiment, the magnetic material may be one or more of a magnetic metal, a polymetallic compound, and a composite composed of metal and non-metal. The winding functional region may be a part or all of the metal strip, that is, in the packaged module, a surface of at least a partial region of the metal strip is covered by the magnetic material. For example, the magnetic material may cover a circumference of the winding functional region by using the winding functional region of the metal strip as the center, so that the magnetic material may be coupled to the winding functional region of the metal strip to implement a function of inductance. This helps simplify the packaging process and reduces manufacturing costs and losses of the circuit module.

In this embodiment, the material of the metal strip may be pure metal, or may be doped with a non-metallic material. A shape of the metal strip may be a cylindrical strip or a thin sheet strip, this is non-limiting. Two ends of the metal strip are coupled to the metal frame. The two ends of the metal strip may be coupled to a side of the metal frame, or may be coupled to the first surface of the metal frame. For example, when either end (for example, an end A) of the metal strip is coupled to the side of the metal frame, the end A may be soldered to the side of the metal frame, or may be integrally formed with the side of the metal frame, which may also be understood as the metal strip extending from the metal frame. When the end A of the metal strip is coupled to the first surface of the metal frame, the end A of the metal strip may be soldered to the first surface of the metal frame. The two ends of the metal strip may be respectively coupled to the metal frame in the same or different manners.

In this embodiment, the "side" refers to a surface parallel to a thickness direction in an approximately two-dimensional or approximately one-dimensional structure whose thickness is greatly less than a length, for example, a strip or a plate. "Integrally formed" means that two mutually coupled surfaces have the same material structure, the two surfaces are in direct contact and are connected by molecular or atomic force, and there is no boundary between the two surfaces. From the perspective of a manufacturing process of the metal strip and the metal frame, a structure with the metal strip and the metal frame coupled may be directly manufactured, with no need to separately manufacture the metal frame and the metal strip, and then couple the metal strip to the metal frame.

In addition, the packaged module provided in this embodiment may alternatively be a 3D stacking structure. In the 3D stacking structure, the metal strip in the packaged module may be a bending structure, and the metal strip of the bending structure may include a supporting part and a stacking part. The supporting part may be on the first surface of the metal frame to raise the stacking part to a specific height, and the stacking part may be stacked over the circuit element to reduce a footprint of the packaged module. Furthermore, a height of the stacking part of the metal strip may alternatively be flexibly adjusted based on a height of the circuit element. If the circuit element is relatively high, the height of the stacking part of the metal strip may increase; otherwise, the height of the stacking part of the metal strip may decrease.

Next, the packaged module provided is further illustrated by using the following embodiments.

Embodiment 1

Figure 4A:
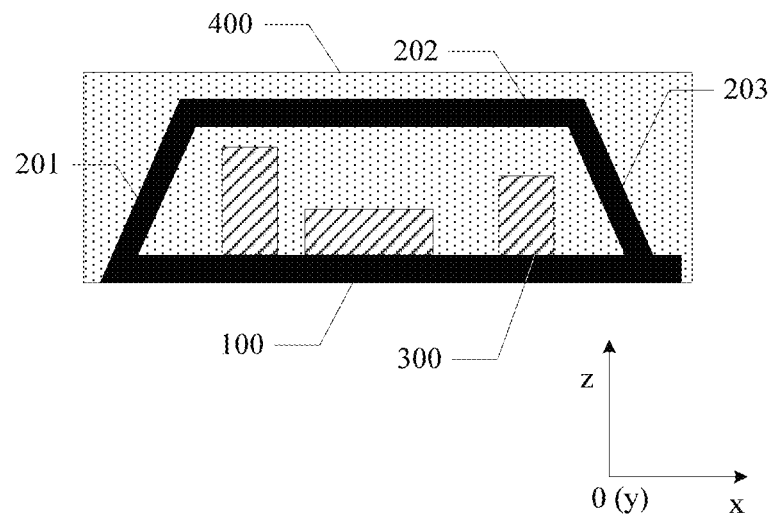
FIG. 4a is a cross-sectional view of a packaged module according to an embodiment.

FIG. 4a shows an example of a cross-sectional view of a packaged module according to an embodiment. As shown in FIG. 4a, the packaged module includes a metal frame 100, a metal strip 200 (which is 201 and 202 in the figure), a circuit element 300, and a magnetic material 400. A first surface of the metal frame 100 bears at least one circuit element 300. One end of the metal strip 200 is integrally formed with a side of the metal frame 100, and the other end of the metal strip 200 is coupled to the first surface of the metal frame 100. The magnetic material covers upper and lower surfaces of the metal strip 202, and the metal strip 202 is coupled to the magnetic material to implement a function of inductance.

In a possible implementation, the metal strip 200 is a bending structure, and includes two supporting parts (a supporting part 201 and a supporting part 203), and a stacking part 202 located between the supporting part 201 and the supporting part 203. The supporting part 201 is located at one end of the metal strip 200 that is coupled to the side of the metal frame 100; the supporting part 203 is located at the other end of the metal strip 200, and is coupled to the first surface of the metal frame 100 through processes such as soldering and pasting. The supporting part 201 and the supporting part 203 may support the stacking part 202, so that the stacking part 202 is stacked over the circuit element 300, to implement a 3D stacking structure, thereby helping reduce a footprint of the packaged module. In a possible implementation, the stacking part 202 may alternatively be parallel to a first surface of a bearing structure. In addition, the metal strip of the bending structure may form a "bridge" above the circuit element, to protect the circuit element from external interference to some extent, thereby further improving working performance of the packaged module.

Figure 4B:
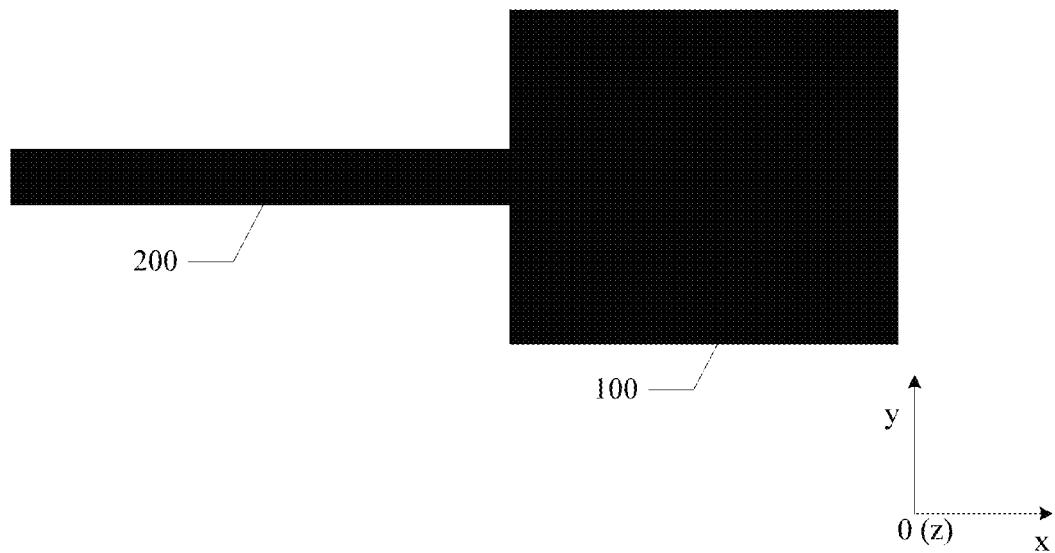
FIG. 4b is a schematic structural diagram of a metal plate according to an embodiment.

For example, the packaged module shown in FIG. 4a may be obtained through packaging based on a metal plate shown in FIG. 4b. As shown in FIG. 4b, the metal plate may include a metal strip 200 and a metal frame 100, and one end of the metal strip 200 is integrally formed with the side of the metal frame 100. FIG. 4b is a top view. For ease of description, an xy plane in an xyz coordinates system is used to represent a plane in the top view, and an xz plane is used to represent a plane in a side view and a cross-sectional view. This is not repeated below.

It may be understood that the metal frame 100 in FIG. 4b is a hollow metal plate. To simplify the schematic diagram 4b, the metal frame 100 is not shown, and an exemplary implementation of the metal frame may be shown in FIG. 2c. All subsequent metal frames 100 are simplified schematic diagrams, and are not described herein.

The packaged module shown in FIG. 4a may be obtained by performing the following main steps based on the metal plate shown in FIG. 4b.

Figure 4C:
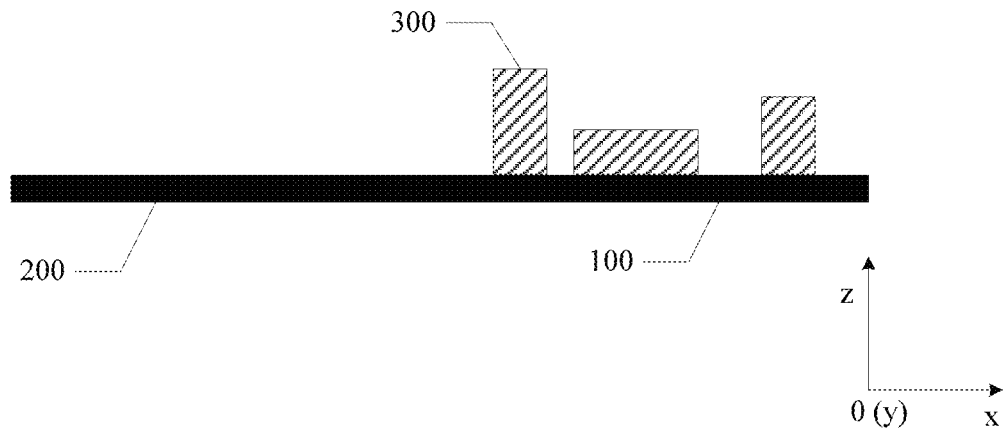
FIG. 4c is a schematic diagram of an intermediate structure according to an embodiment.

Step 401: Assemble a circuit element 300 on the first surface of the metal frame 100 to obtain an intermediate structure shown in FIG. 4c.

Figure 4D:
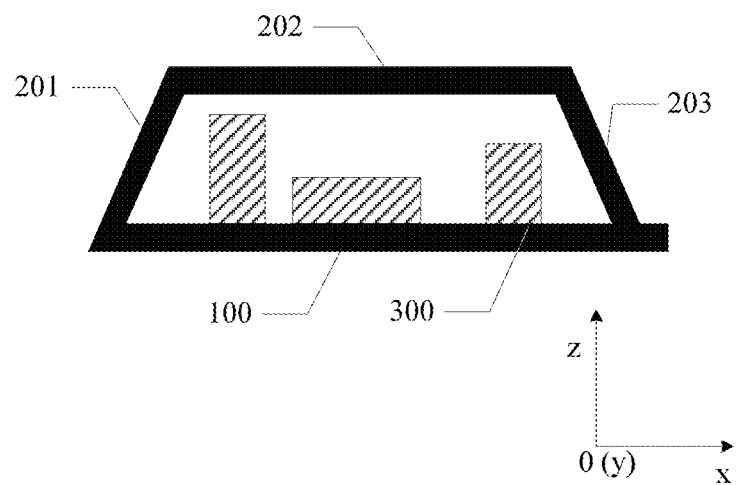
FIG. 4d is another schematic diagram of an intermediate structure according to an embodiment.

Step 402: As shown in FIG. 4d, fold the metal strip 200 into a bending structure, and couple one end of the metal strip 200 that is not coupled to the side of the metal frame 100 to the first surface of the metal frame 100. The folded metal strip 200 includes a supporting part 201, a supporting part 203, and a stacking part 202 located between the supporting part 201 and the supporting part 203.

Step 403: Dispose the magnetic material on a surface of a winding functional region of the metal strip 200. The winding functional region of the metal strip 200 may be a part or all of the metal strip 200. In other words, the magnetic material may cover the surface of the partial region of the metal strip 200, or the magnetic material may cover the entire surface of the metal strip. It may be understood that the surface of the metal strip 200 in this embodiment may be a surface of the metal strip 200 other than sides at two ends, or may be a surface parallel to a length direction of the metal strip. For example, if the magnetic material may be disposed on surfaces of the supporting part 201 and the supporting part 203, the supporting part 201 and the supporting part 203 are the winding functional region of the metal strip 200. For another example, if the magnetic material may be disposed on a surface of the stacking part 202, the stacking part 202 is the winding functional region of the metal strip 200. The magnetic material is disposed on the surface of the winding functional region, so that the winding functional region can be coupled to the magnetic material to implement a function of inductance.

In a possible implementation, the magnetic material may be a magnetic core, and the magnetic core is attached to the surface of the winding functional region of the metal strip 200, so that the magnetic material covers the winding functional region of the metal strip 200.

In another possible implementation, the magnetic material may be a material with fluidity, in the form of particles, powder, liquid, or the like, and the surface of the winding functional region of the metal strip 200 may be covered by the magnetic material. In addition, the magnetic material may be used to replace a current plastic package material to package the intermediate structure shown in FIG. 4c. The intermediate structure shown in FIG. 4c may be placed in a packaging mold and the magnetic material is injected into the packaging mold. The magnetic material fills gaps in the intermediate structure shown in FIG. 4c, and then processes such as pressing, curing, demolding, and electrode manufacturing are performed to obtain the packaged module shown in FIG. 4a.

The packaged module shown in FIG. 4a may also have a regular outer surface. For details, refer to the outer surfaces of the PSiP-packaged modules shown in FIG. 2a and FIG. 2b. A difference lies in that the outer surface of the PSiP-packaged module is made of a plastic package material and the outer surface of the packaged module provided in this embodiment may alternatively be made of the magnetic material 400.

Embodiment 2

Figure 5A:
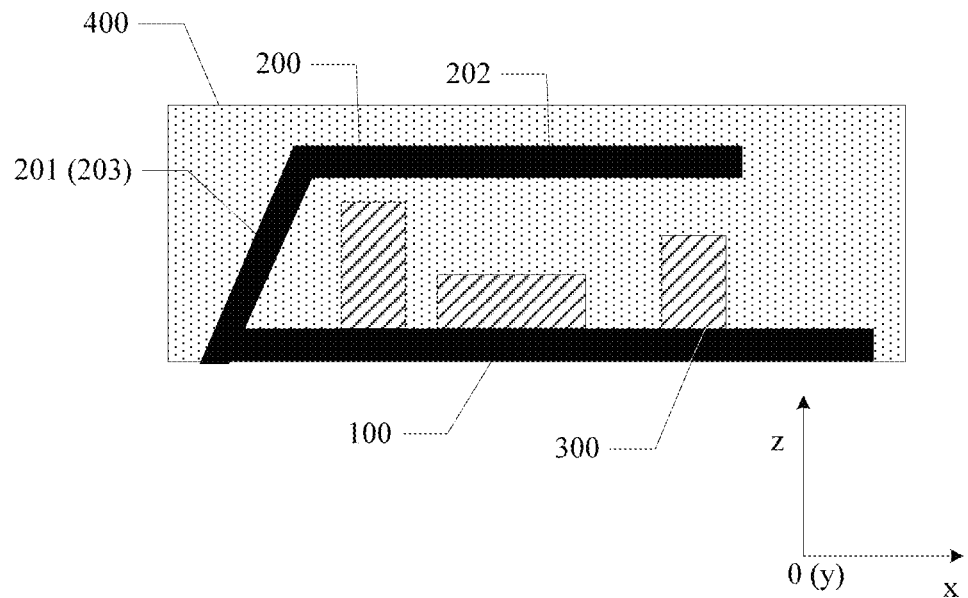
FIG. 5a is a cross-sectional view of a packaged module according to an embodiment.

FIG. 5a shows an example of a cross-sectional view of another packaged module according to an embodiment. In the packaged module shown in FIG. 5a, a metal strip 200 has a bending structure, and two ends of the metal strip 200 are both coupled to a side of a metal frame 100. A supporting part 201 and a supporting part 203 of the metal strip 200 are disposed side by side along the side of the metal frame 100. Therefore, only the supporting part 201 is shown in the side view of FIG. 5a. The supporting part 201 and a supporting part 203 of the metal strip 200 may support a stacking part 202, so that the stacking part 202 can be stacked over a circuit element 300.

Figure 5B:
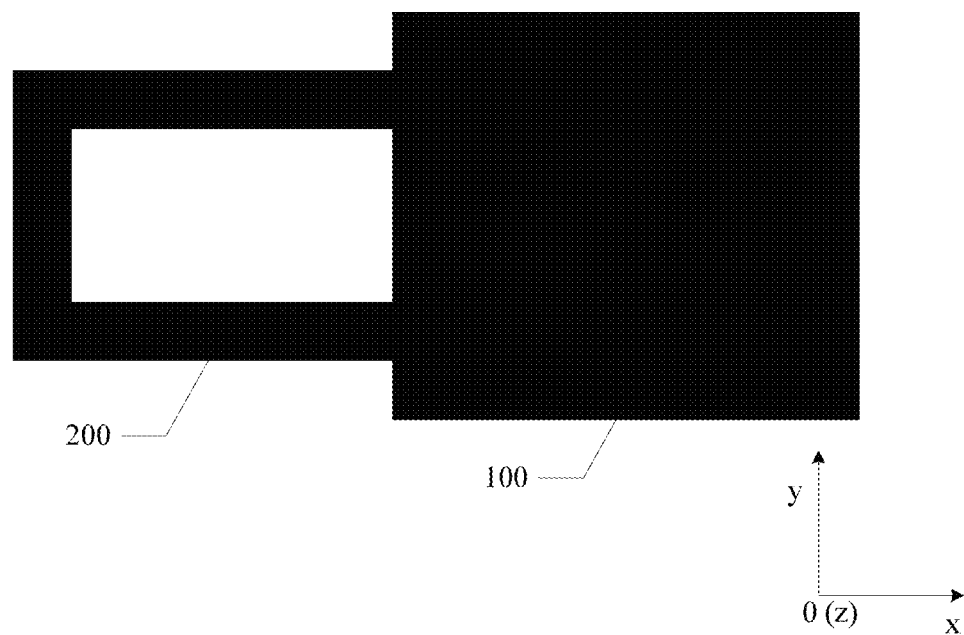
FIG. 5b is a schematic structural diagram of a metal plate according to an embodiment.

For example, the packaged module shown in FIG. 5a may be obtained through packaging based on a metal plate shown in FIG. 5b. As shown in FIG. 5b, the metal plate includes a metal strip 200 and a metal frame 100, the metal strip 200 is a bending structure, and two ends of the metal strip 200 are each integrally formed with the side of the metal frame 100. It may be understood that the bending structure of the metal strip 200 may be an approximately rectangular structure shown in FIG. 5b, or may be an arc-shaped bending structure, or may be a triangular bending structure, or the like.

The packaged module shown in FIG. 5a may be obtained by performing the following main steps based on the metal plate shown in FIG. 5b.

Step 501: Assemble a circuit element 300 on a first surface of the metal frame 100 to obtain an intermediate structure shown in FIG. 5c.

Figure 5C:
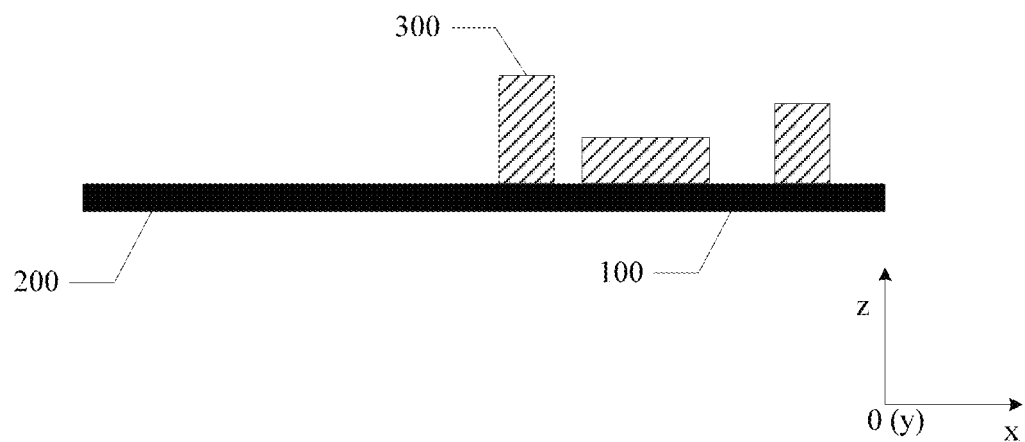
FIG. 5c is a schematic diagram of an intermediate structure according to an embodiment.
Figure 5D:
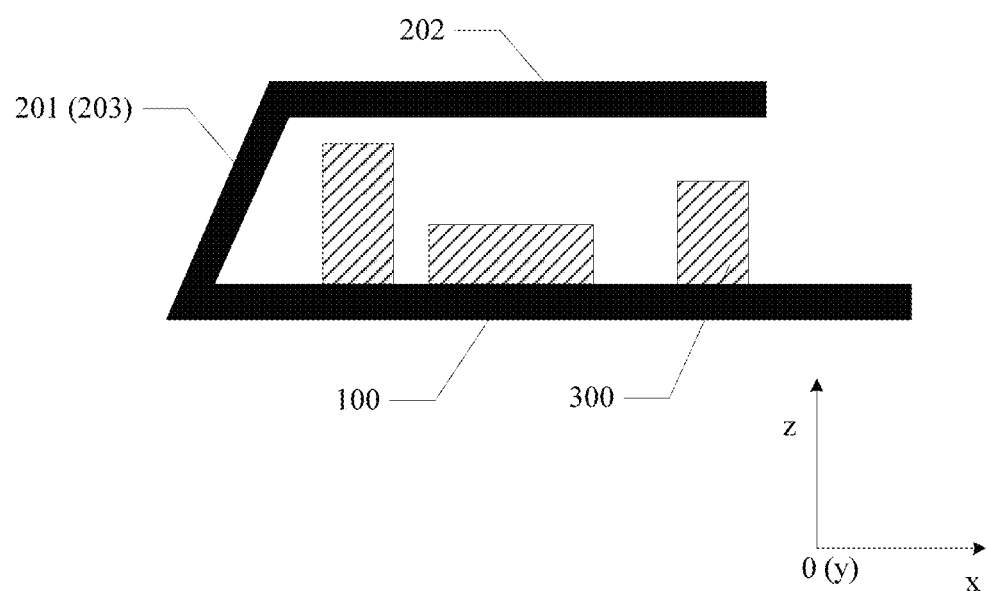
FIG. 5d is another schematic diagram of an intermediate structure according to an embodiment.
Figure 5E:
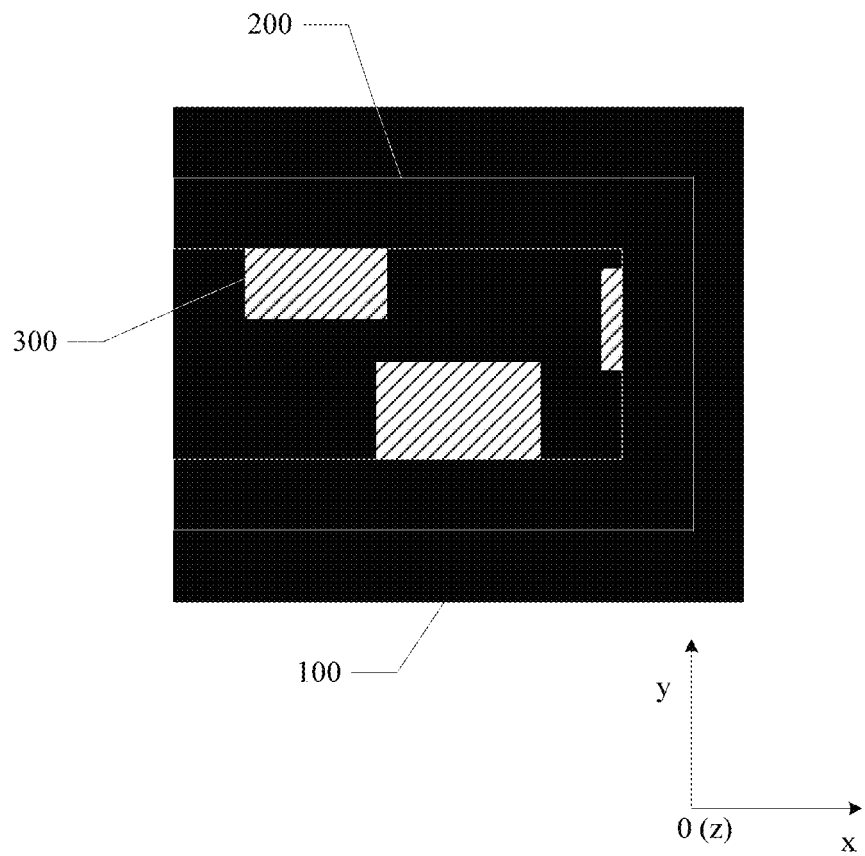
FIG. 5e is another schematic diagram of an intermediate structure according to an embodiment.

Step 502: As shown in FIG. 5d, fold the metal strip 200 into a bending structure. FIG. 5e is a top view corresponding to FIG. 5d. It may be understood with reference to FIG. 5d and FIG. 5e that the folded metal strip 200 includes a supporting part 201, a supporting part 203, and a stacking part 202 located between the supporting part 201 and the supporting part 203.

Step 503: Dispose a magnetic material 400 on a surface of a winding functional region of the metal strip 200.

In step 503, the solution of using the magnetic material 400 to package the intermediate structure in Embodiment 1 may also be used to obtain the packaged module shown in FIG. 5a. For an exemplary implementation, refer to Embodiment 1. Details are not described herein again.

In addition, this embodiment further provides another implementation of packaging the intermediate structure. After the intermediate structure shown in FIG. 5c is obtained, the intermediate structure shown in FIG. 5c may be placed in a packaging mold. The packaging mold includes two cavities. One cavity A is used to place the metal frame 100 and the circuit element 300, and the other cavity B is used to place the stacking part 202 of the metal strip 200. A plastic package material 500 is injected into the cavity A of the packaging mold, and the magnetic material 400 is injected into the cavity B, to obtain an intermediate structure shown in FIG. 5f. A length of the supporting part 201 is not less than a thickness of the plastic package material 500.

Figure 5F:
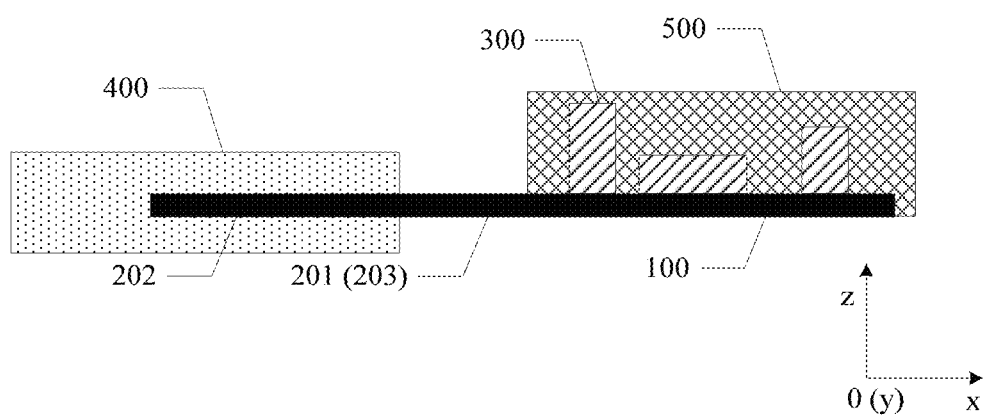
FIG. 5f is another schematic diagram of an intermediate structure according to an embodiment.
Figure 5G:
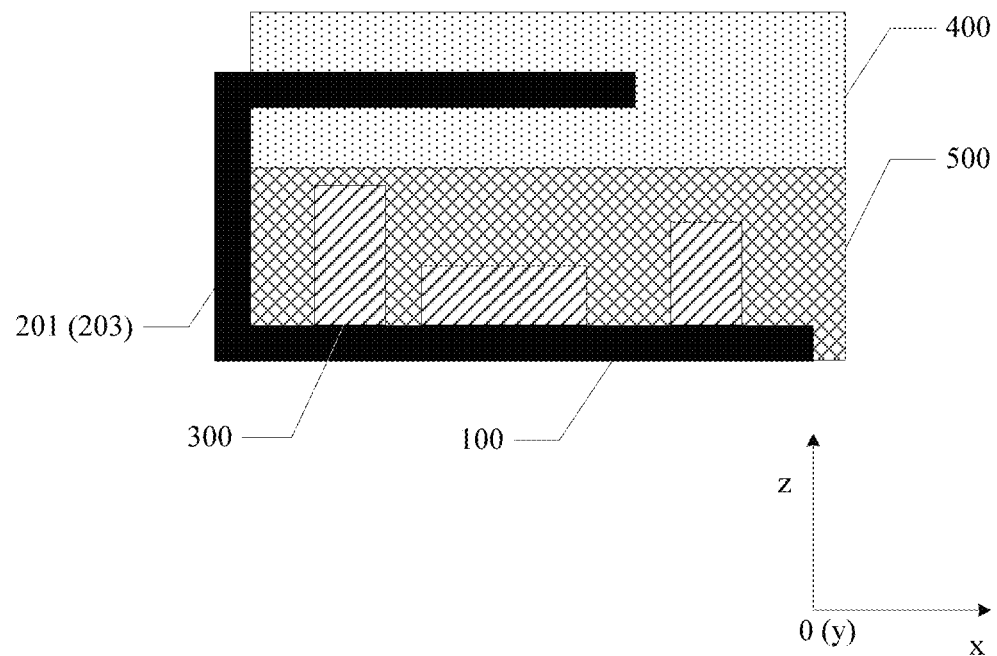
FIG. 5g is a cross-sectional view of a packaged module according to an embodiment.

The metal strip 200 in FIG. 5f is folded until the stacking part 202 of the metal strip 200 is folded to a position over the plastic package material 500, and then the magnetic material 400 is fastened to the plastic package material 500, so as to obtain the packaged module shown in FIG. 5g. As shown in FIG. 5g, the plastic package material 500 covers the circuit element 300, and the magnetic material 400 fills other space inside the packaged module.

It may be understood that the intermediate structure shown in FIG. 5c may alternatively be first placed in a packaging mold A, and the plastic package material 500 is then injected into the packaging mold A, so that the plastic package material 500 covers the circuit element 300. After the metal strip 200 is folded, the obtained intermediate structure is placed in a packaging mold B, and the magnetic material 400 is injected into the packaging mold B, so that the magnetic material 400 fills other space inside the packaged module, and the packaged module shown in FIG. 5f is also obtained.

Embodiment 3

Figure 6A:
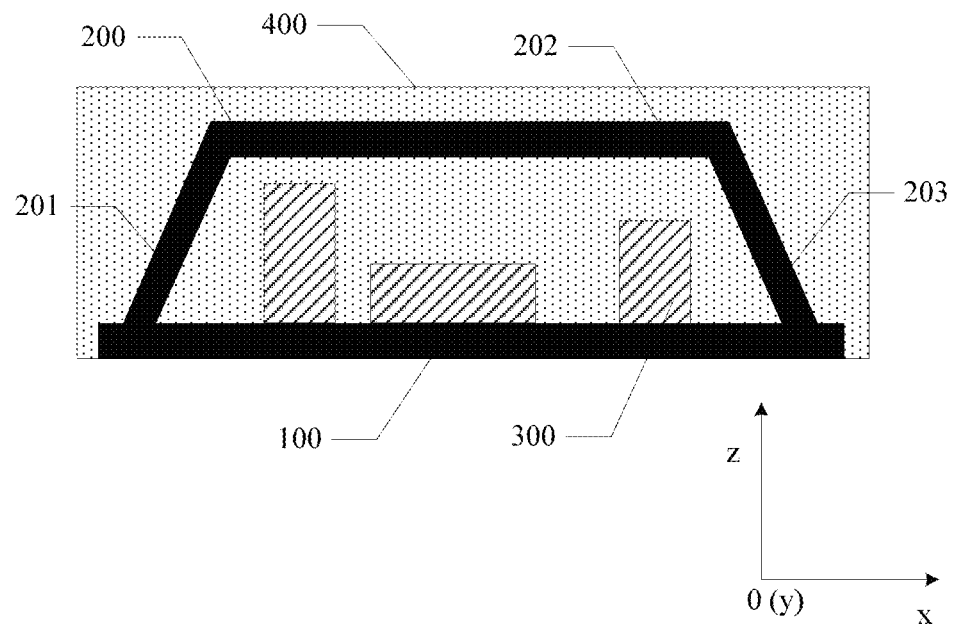
FIG. 6a is a cross-sectional view of a packaged module according to an embodiment.

FIG. 6a shows an example of a cross-sectional view of a packaged structure according to an embodiment. As shown in FIG. 6a, two ends of the metal strip 200 are coupled to a first surface of the metal frame 100. The metal strip 200 is a bending structure, and includes a supporting part 201 and a supporting part 203 that are respectively located at the two ends of the metal strip 200 and a stacking part 202 located between the supporting part 201 and the supporting part 203. The supporting part 201 and the supporting part 203 support the stacking part 202, so that the stacking part 202 may be stacked over the circuit element 300. The magnetic material 400 covers a surface of the metal strip 200, and the metal strip 200 is coupled to the magnetic material 400 to implement a function of inductance.

For example, the packaged module shown in FIG. 6a may be obtained by performing the following steps.

Step 601: Assemble a circuit element 300 on the first surface of the metal frame 100.

Step 602: Fold the metal strip 200 into a bending structure, and couple two ends of the metal strip 200 to the first surface of the metal frame 100.

Step 603: Dispose a magnetic material 400 on a surface of a winding functional region of the metal strip 200. In an exemplary implementation, an intermediate structure obtained in step 602 may be packaged with a magnetic material, so as to obtain the packaged module shown in FIG. 6a. For an exemplary implementation process, refer to Embodiment 1. Details are not described herein again.

Figure 6B:
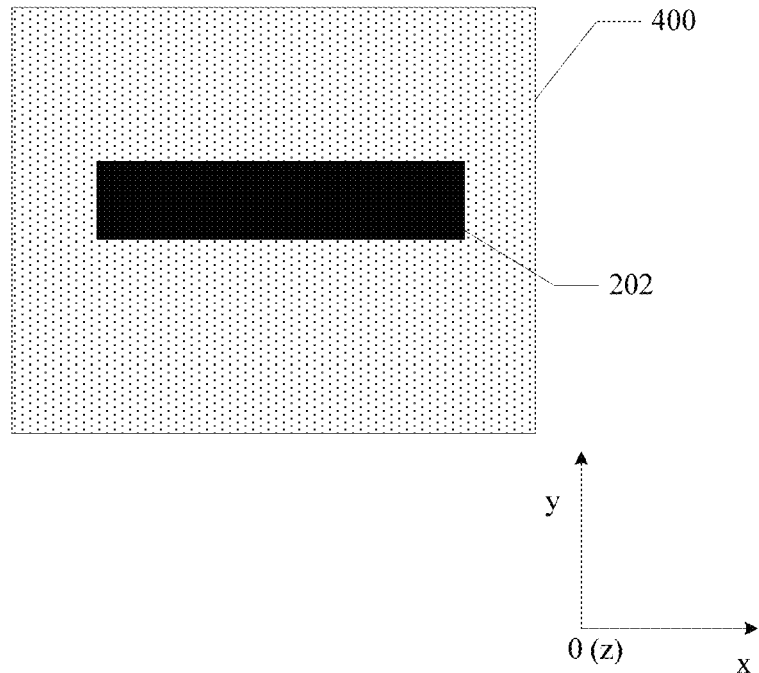
FIG. 6b is a top view of a packaged module according to an embodiment.
Figure 6C:
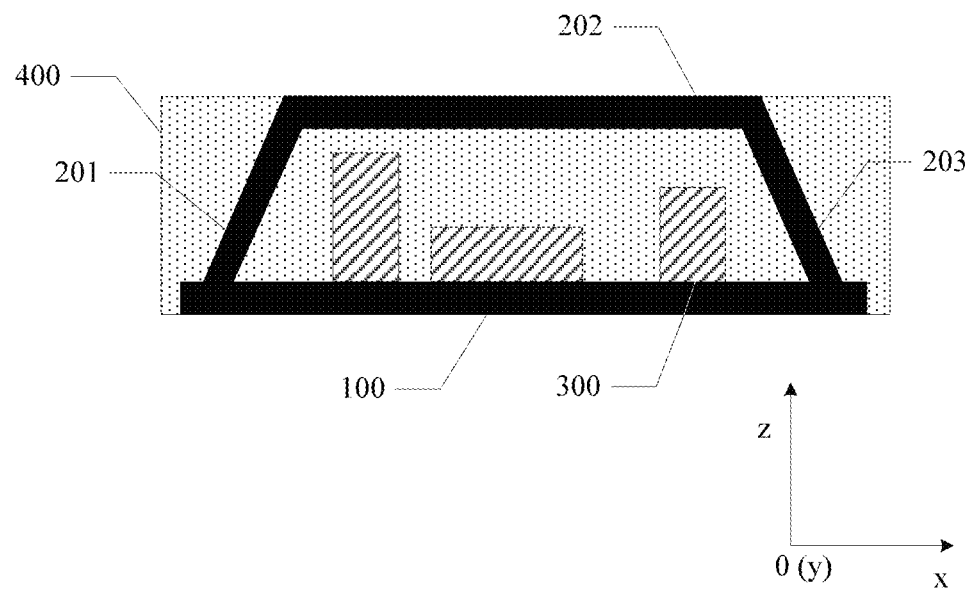
FIG. 6c is a cross-sectional view of a packaged module according to an embodiment.

In a possible implementation, a surface of the stacking part 202 of the metal strip 200 may also be exposed to the magnetic material to form an outer surface, so as to enhance a heat dissipation capability of the packaged module. For example, a top view of the packaged module may be shown in FIG. 6b, and a cross-sectional view may be shown in FIG. 6c. As shown in FIG. 6b and FIG. 6c, an upper surface of the packaged module is made of the magnetic material 400, and one surface of the stacking part 202 is exposed to an outer surface made of the magnetic material. The metal strip 200 is made of metal and features high thermal conductivity. Therefore, the stacking part 202 can more quickly conduct heat generated inside the packaged module to outside of the packaged module when the packaged module is working, thereby helping improve a heat dissipation capability of the packaged module. It may be understood from the cross-sectional view shown in FIG. 6c that the surfaces of the supporting part 201 and the supporting part 203 of the metal strip 200 are still covered with the magnetic material, so that the supporting part 201 may still act as a winding functional region and be coupled to the magnetic material 400, so as to implement a function of inductance.

Embodiment 4

A packaged module provided in this embodiment further supports a multi-inductance circuit. The packaged module may include a plurality of metal strips 200, all surfaces of winding functional regions of the plurality of metal strips 200 are covered with a magnetic material, and all the winding functional regions of the plurality of metal strips 200 may be coupled to the magnetic material, so as to implement functions of a plurality of inductors.

Figure 7A:
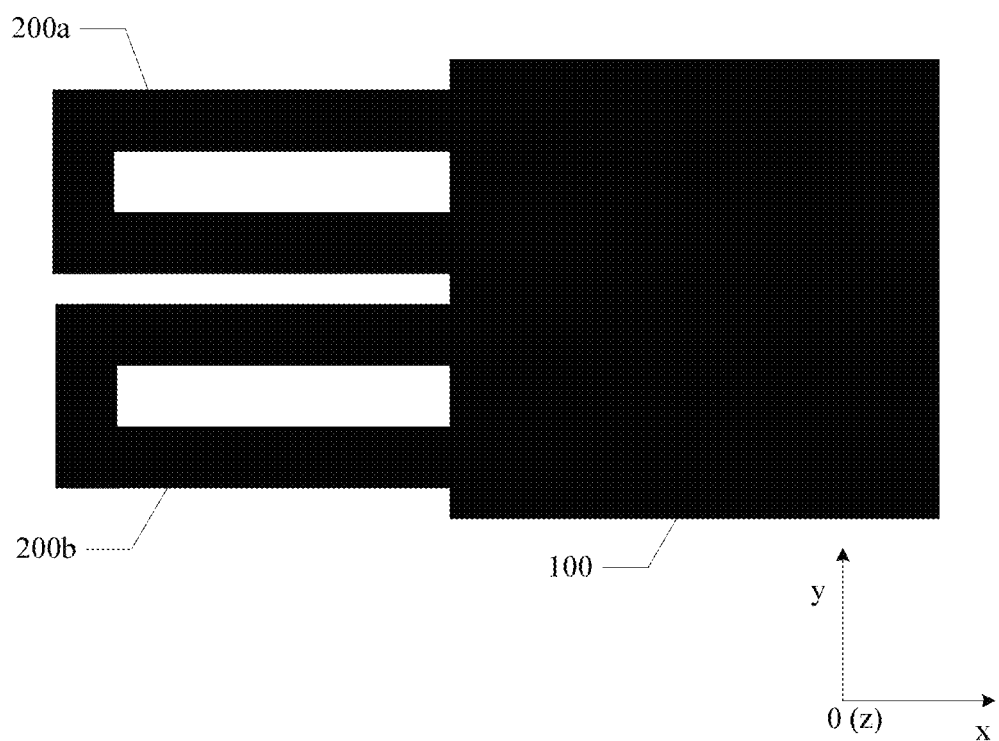
FIG. 7a is a schematic structural diagram of a metal plate according to an embodiment.
Figure 7B:
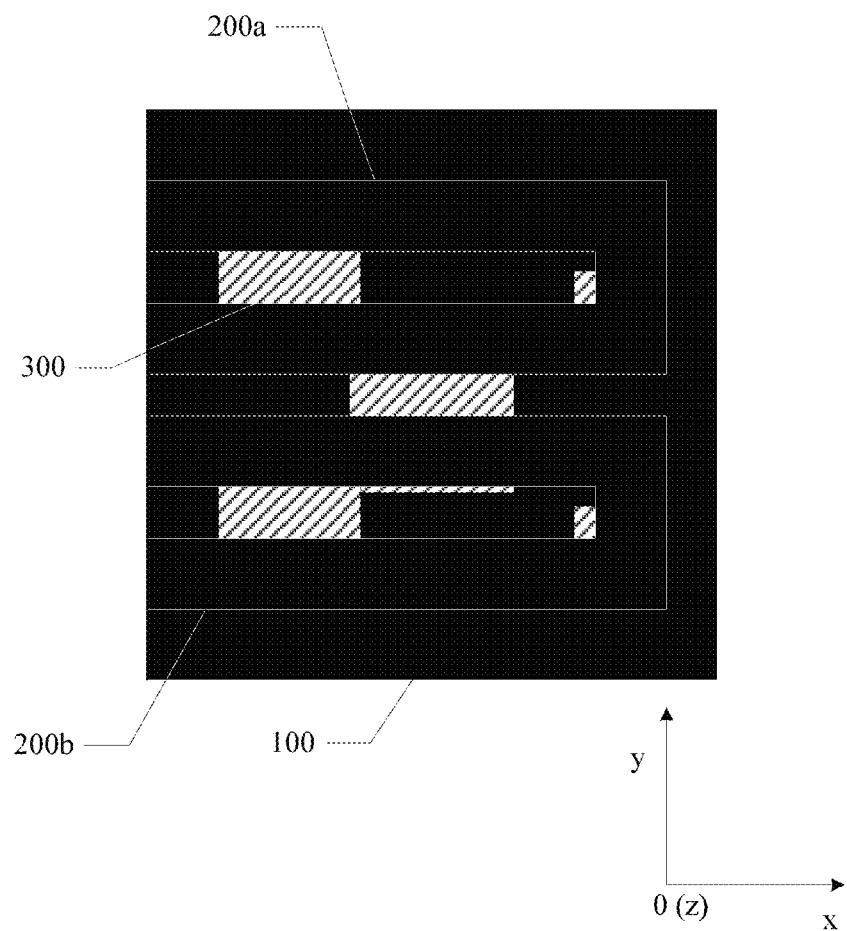
FIG. 7b is a schematic diagram of an intermediate structure according to an embodiment.

In an example, the packaged module shown in FIG. 5a may include a plurality of metal strips 200, and two ends of each of the plurality of metal strips 200 are coupled to a side of the metal frame 100. For example, a metal plate constituting the packaged module may be shown in FIG. 7a, and the metal plate may include a plurality of metal strips (a metal strip 200a and a metal strip 200b). Two ends of the metal strip 200a and two ends of the metal strip 200b are coupled to one side of the metal frame 100. Moreover, both the metal strip 200a and the metal strip 200b are bending structures and are disposed side by side along a side of the metal frame 100. The metal strip 200a and the metal strip 200b in FIG. 7a are folded into bending structures. A side view of the obtained intermediate structure is similar to that in FIG. 5d, and a top view may be shown in FIG. 7b. Subsequent packaging processes are similar to those in the foregoing embodiments, and details are not repeated herein.

Figure 8A:
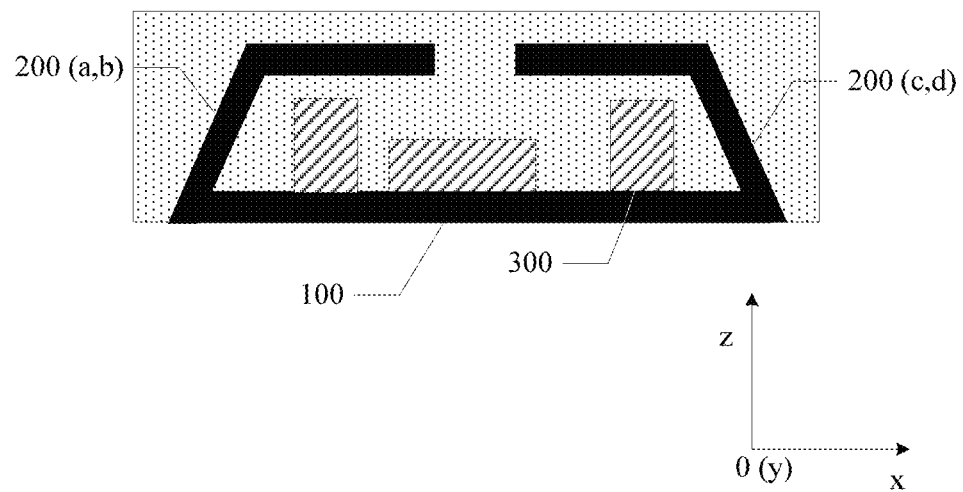
FIG. 8a is a cross-sectional view of a packaged module according to an embodiment.
Figure 8B:
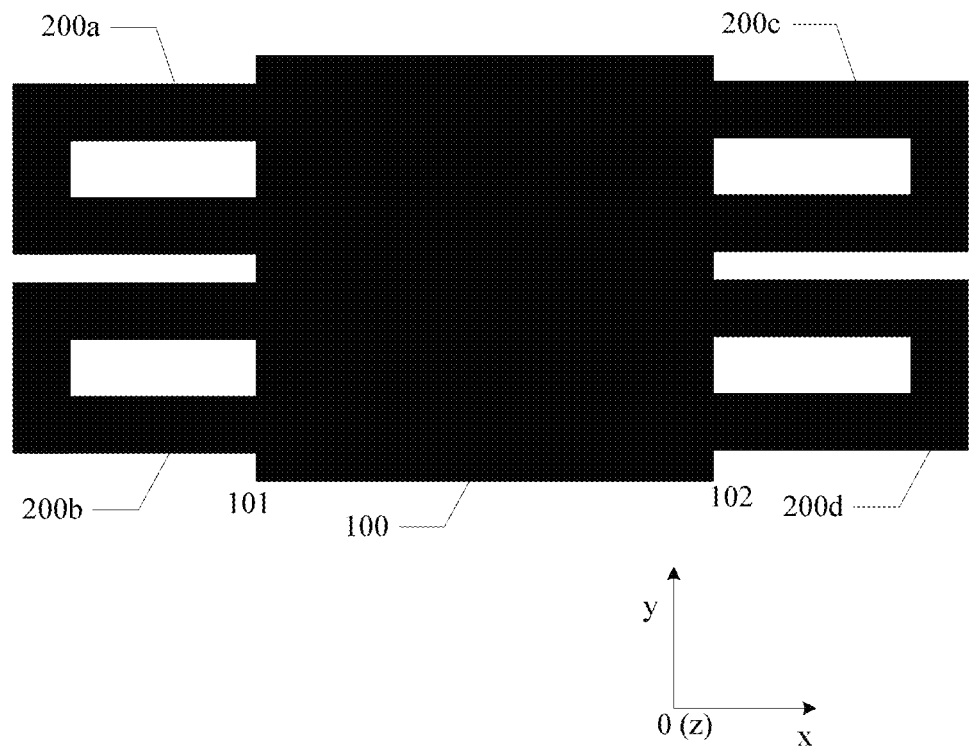
FIG. 8b is a schematic structural diagram of a metal plate according to an embodiment.
Figure 8C:
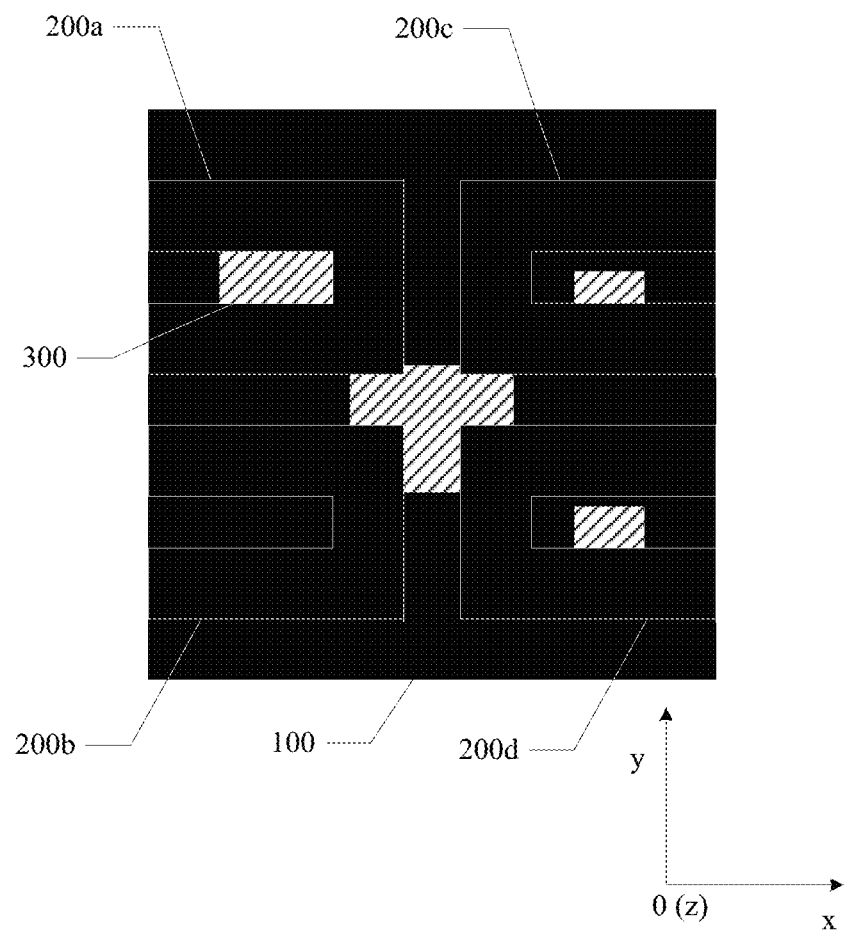
FIG. 8c is a schematic diagram of an intermediate structure according to an embodiment.
Figure 8D:
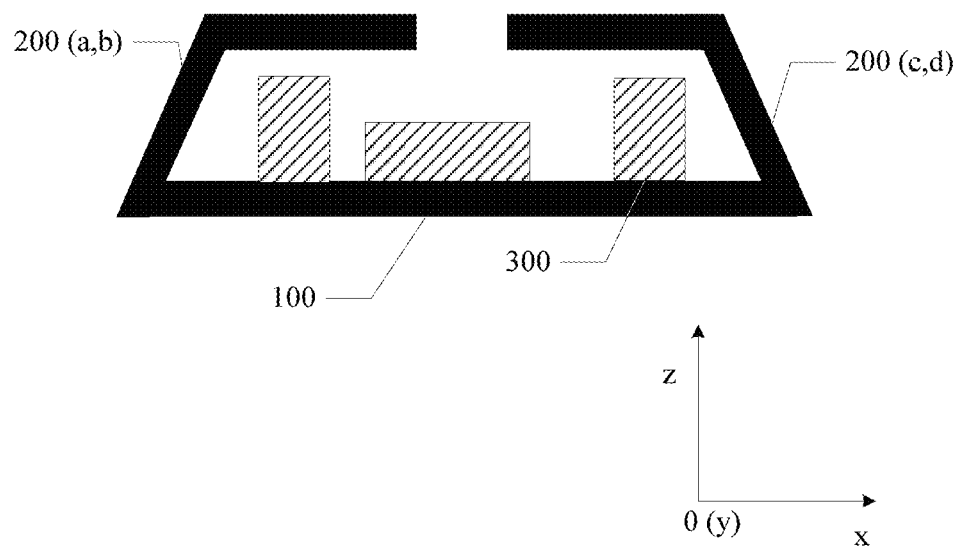
FIG. 8d is another schematic diagram of an intermediate structure according to an embodiment.

In another example, as shown in a cross-sectional view of a packaged module in FIG. 8a, the packaged module may include a plurality of metal strips 200a to 200d. Each metal strip has a bending structure, and two ends of the metal strip 200a and two ends of the metal strip 200b are coupled to different sides of the metal frame. For example, a metal plate constituting the packaged module may be shown in FIG. 8b. The metal plate may include a plurality of metal strips 200a to 200d. Two ends of the metal strip 200a and two ends of the metal strip 200b are coupled to a side 101 of the metal frame 100, and two ends of the metal strip 200c and two ends of the metal strip 200d are coupled to a side 102 of the metal frame 100. In a possible implementation, the metal frame 100 has a rectangular structure, and the side 101 and the side 102 are opposite to each other in the rectangular structure. The metal strips 200a to 200d in FIG. 8b are folded into bending structures, to obtain an intermediate structure shown in FIG. 8c and FIG. 8d. FIG. 8c is a top view of the intermediate structure, and FIG. 8d is a cross-sectional view of the intermediate structure.

Figure 9A:
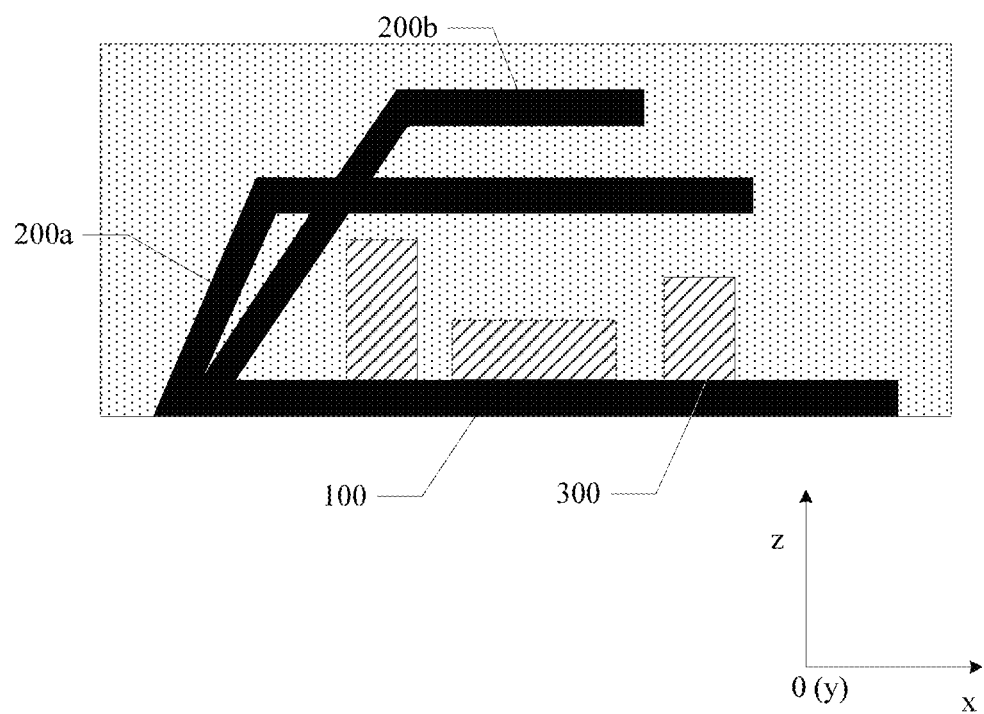
FIG. 9a is a cross-sectional view of a packaged module according to an embodiment.
Figure 9B:
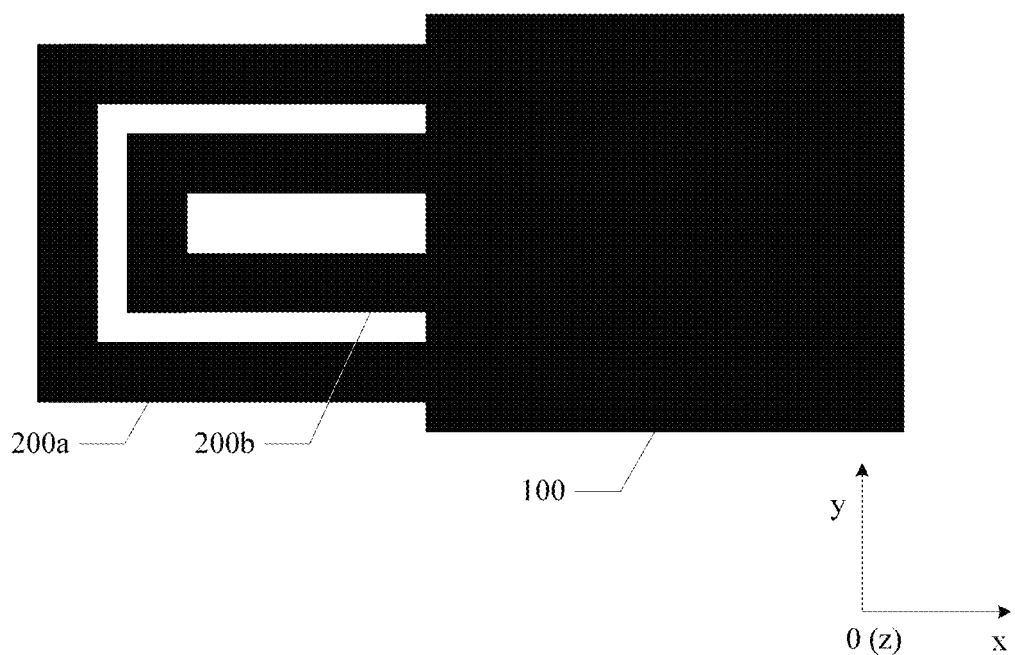
FIG. 9b is a schematic structural diagram of a metal plate according to an embodiment.
Figure 9C:
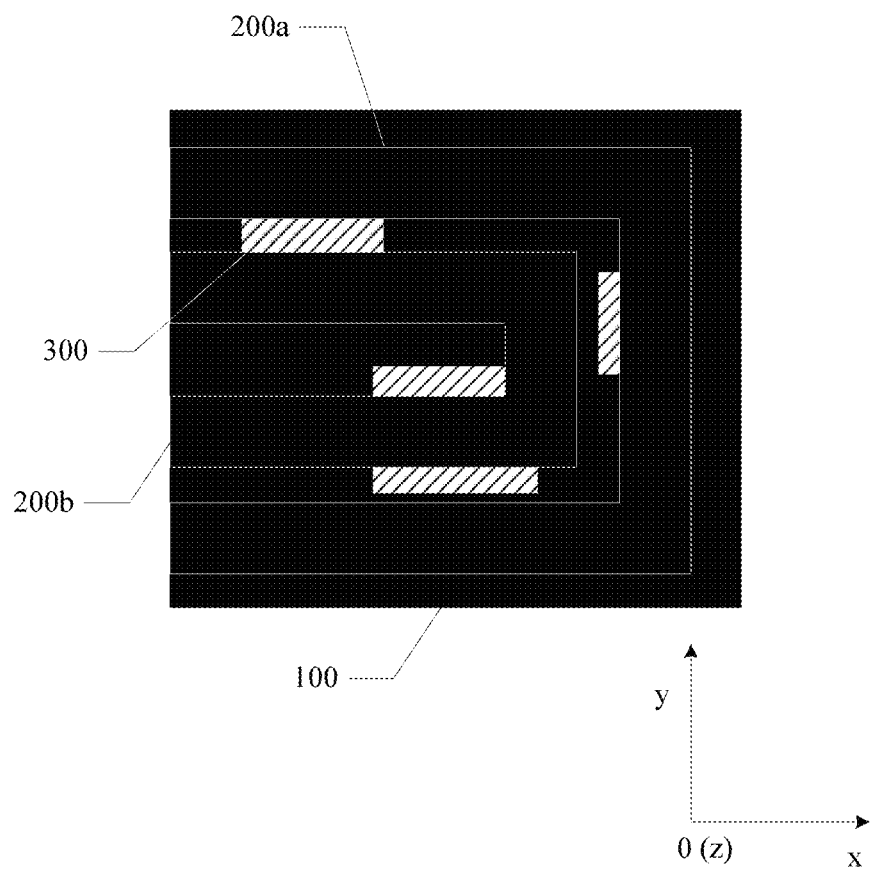
FIG. 9c is a schematic diagram of an intermediate structure according to an embodiment.
Figure 9D:
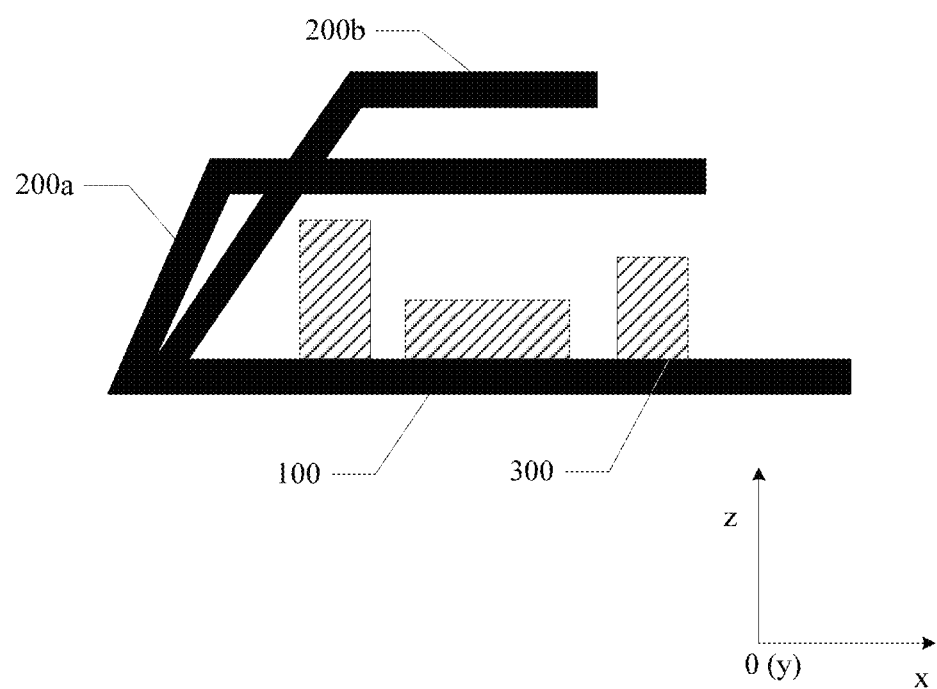
FIG. 9d is another schematic diagram of an intermediate structure according to an embodiment.

In yet another example, as shown in a cross-sectional view of a packaged module in FIG. 9a, the packaged module includes a plurality of metal strips (200a and 200b). The metal strip 200a and the metal strip 200b are both bending structures, and two ends of the metal strip 200a and two ends of the metal strip 200b are coupled to one side of the metal frame, and two ends of the metal strip 200b are located between the two ends of the metal strip 200a. For example, a metal plate constituting the packaged module shown in FIG. 9a may be shown in FIG. 9b. The metal plate includes a plurality of metal strips (a metal strip 200a and a metal strip 200b). Two ends of the metal strip 200a and two ends of the metal strip 200b are coupled to one side of the metal frame 100. Moreover, the metal strip 200a and the metal strip 200b are both bending structures, and the two ends of the metal strip 200b are disposed between the two ends of the metal strip 200a. The metal strip 200a and the metal strip 200b in FIG. 9b are folded to obtain an intermediate structure shown in FIG. 9c and FIG. 9d. FIG. 9c is a top view of the intermediate structure, and FIG. 9d is a cross-sectional view of the intermediate structure.

Figure 10A:
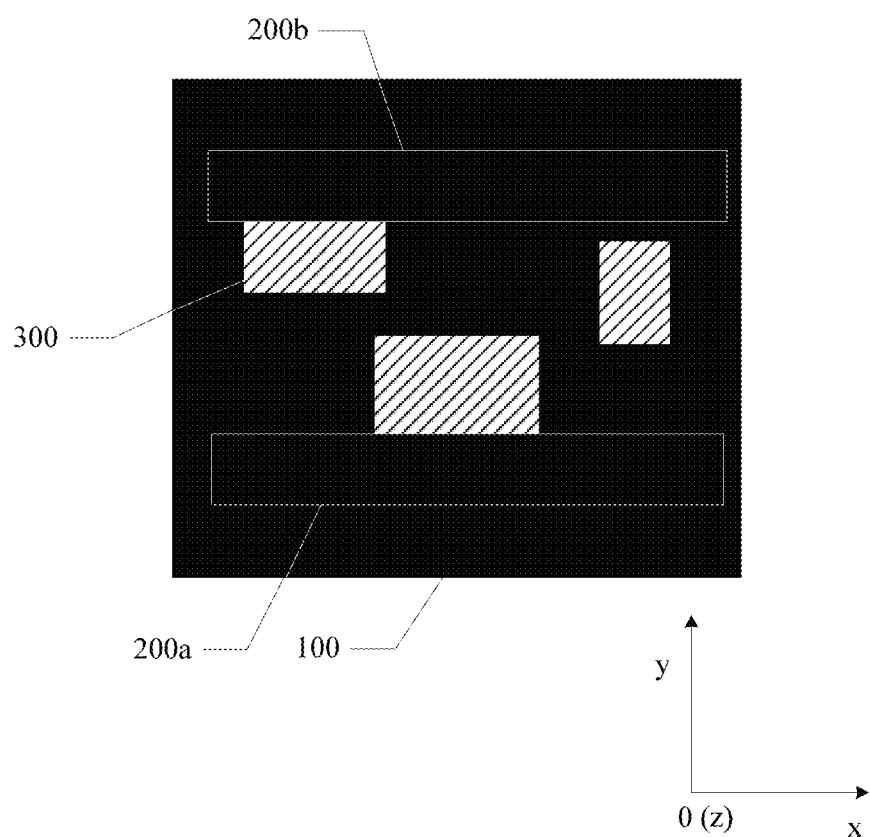
FIG. 10a is a schematic diagram of an intermediate structure according to an embodiment.

In another example, the packaged module shown in FIG. 6a may also include a plurality of metal strips 200. All of the plurality of metal strips 200 have the bending structure shown in FIG. 6a, and the plurality of metal strips 200a are disposed side by side along a first surface of the metal frame 100. For example, after the two ends of the metal strip 200 are coupled to the first surface of the metal frame 100 in step 602, the intermediate structure shown in FIG. 10a may be obtained. The packaged module including the plurality of metal strips 200 may be obtained by packaging the intermediate structure shown in FIG. 10a using the magnetic material 400.

Figure 10B:
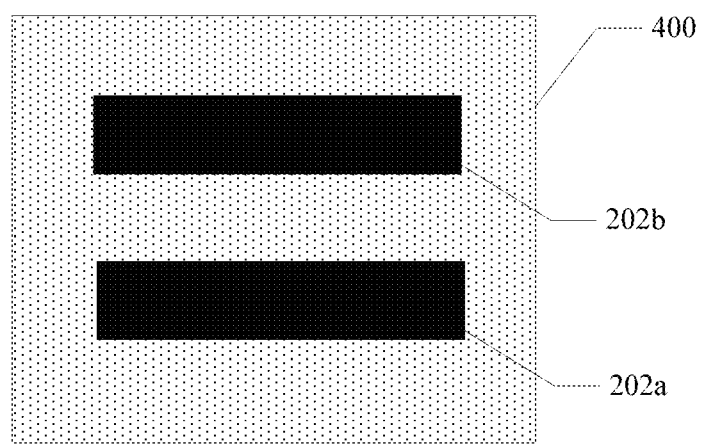
FIG. 10b is a top view of a packaged module according to an embodiment.

In a possible implementation, an outer surface of the packaged module may be shown in FIG. 10b. The outer surface is formed by the magnetic material 400, and a surface of the supporting part 202a of the metal strip 200a and a surface of the supporting part 202b of the metal strip 200b are exposed to the outer surface. In other words, both the supporting part 202a of the metal strip 200a and the supporting part 202b of the metal strip 200b may be used for heat dissipation of the packaged module, to further improve the heat dissipation capability of the packaged module.

To sum up, the packaged module provided in this embodiment may be used not only as a circuit module with one inductor, but also as a circuit module with a plurality of inductors, for example, a transformer module and a transformer and inductor integrated module. Therefore, the packaged module provided in this embodiment helps improve performance of the circuit module and can also be adapted to more complex circuit designs.

Figure 11:
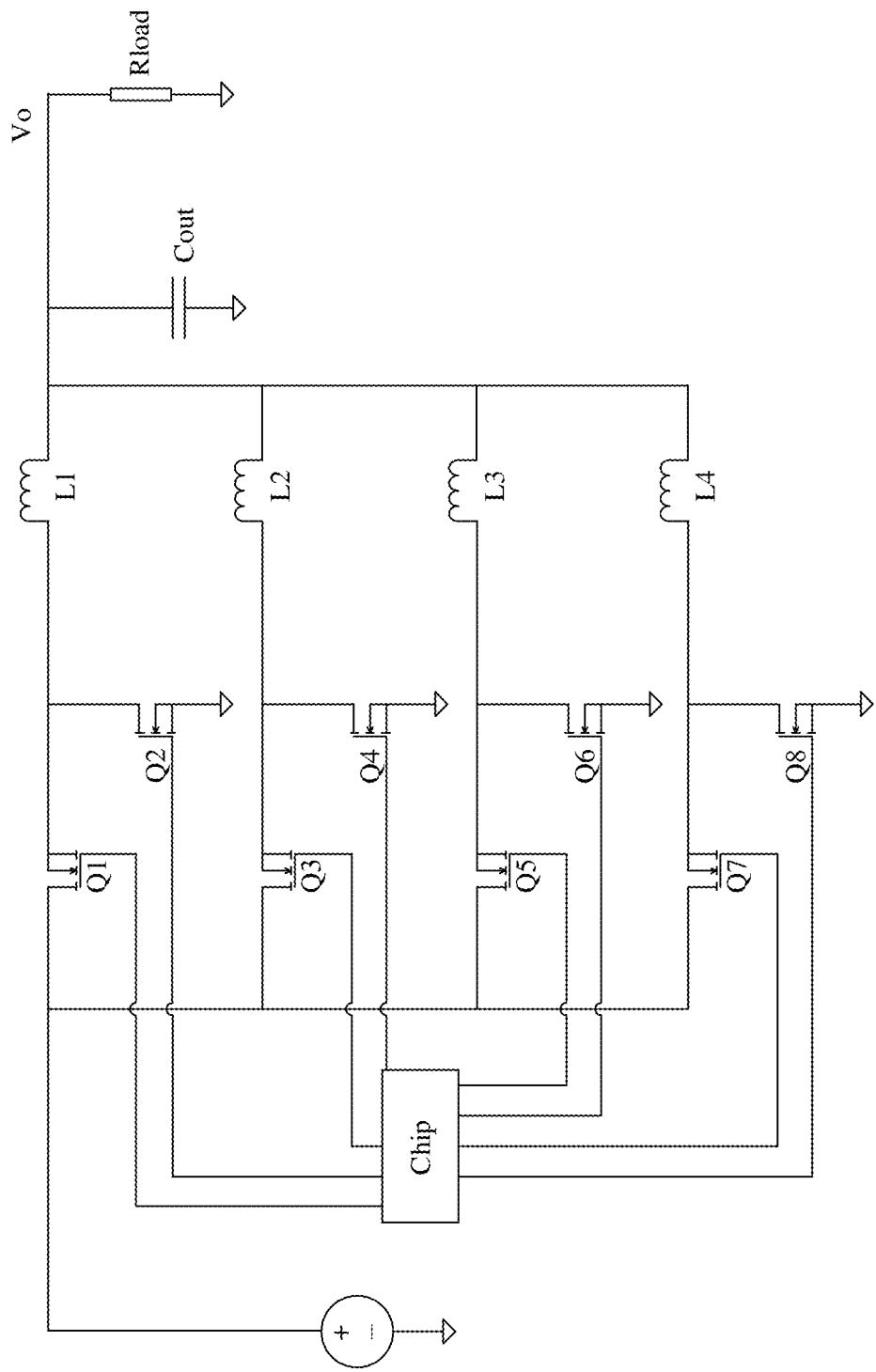
FIG. 11 is a schematic structural diagram of a power circuit according to an embodiment.

For example, a switching power circuit shown in FIG. 11 may be implemented by using the packaged module provided in this embodiment. The switching power circuit shown in FIG. 11 may be a circuit of the power module, and includes four switching power paths connected in parallel, that is, the switching power circuit shown in FIG. 11 is a multi-phase power circuit.

A transistor Q1, a transistor Q2, and an inductor L1 form one of the switching power paths. A first electrode of the transistor Q1 is connected to an external DC power supply, a second electrode is coupled to the first electrode of the transistor Q2 and an input terminal of the inductor L1, and a control electrode is coupled to a chip. A second electrode of the transistor Q2 is grounded, and the control electrode is coupled to the chip. Similarly, a transistor Q3, a transistor Q4, and an inductor L2 form a switching power path, a transistor Q5, a transistor Q6, and an inductor L3 form a switching power path, and a transistor Q7, a transistor Q8, and an inductor L4 form a switching power path. The four switching power paths are connected in parallel to a first electrode of a capacitor Cout, and a second electrode of the capacitor Cout is grounded. Through the capacitor Cout, a voltage Vo may be output to a load Rload.

In the switching power circuit shown in FIG. 11, the chip, the transistors Q1 to Q8, the inductors L1 to L4, and the capacitor Cout can be all accommodated in the packaged module, which helps to reduce overall circuit costs. If a single-inductor packaged mode is used, at least four packaged modules need to be interconnected to implement the circuit shown in FIG. 11. However, with the packaged module with a plurality of inductors provided in this embodiment, only one packaged module is required to implement the circuit shown in FIG. 11.

Embodiment 5

As shown in FIG. 2*a*, a current packaged module is completely packaged by a plastic package material. Although the plastic package material can protect internal elements of the packaged module, the plastic package material also reduces a heat dissipation capability of the packaged module.

In view of this, the packaged module provided in this embodiment may further include a heat dissipation plate. The heat dissipation plate has a relatively high thermal conductivity. For example, the heat dissipation plate may be made of metal. One surface of the heat dissipation plate is exposed to an outer surface of the packaged module. Therefore, this helps improve the heat dissipation capability of the packaged module.

Figure 12A:
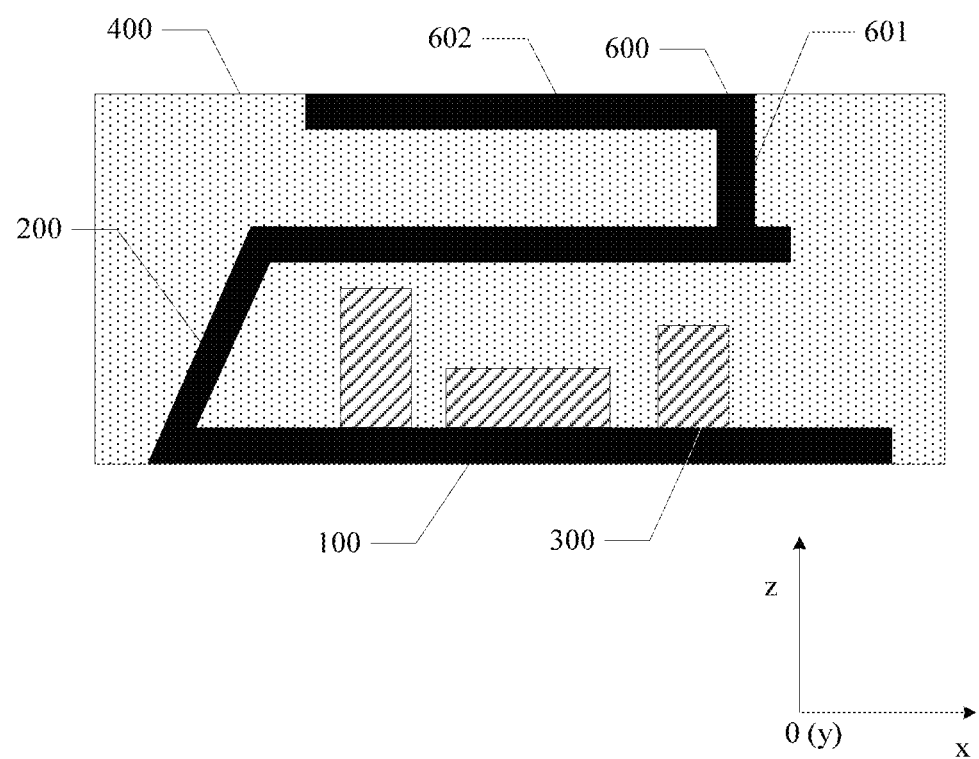
FIG. 12a is a cross-sectional view of a packaged module according to an embodiment.
Figure 12B:
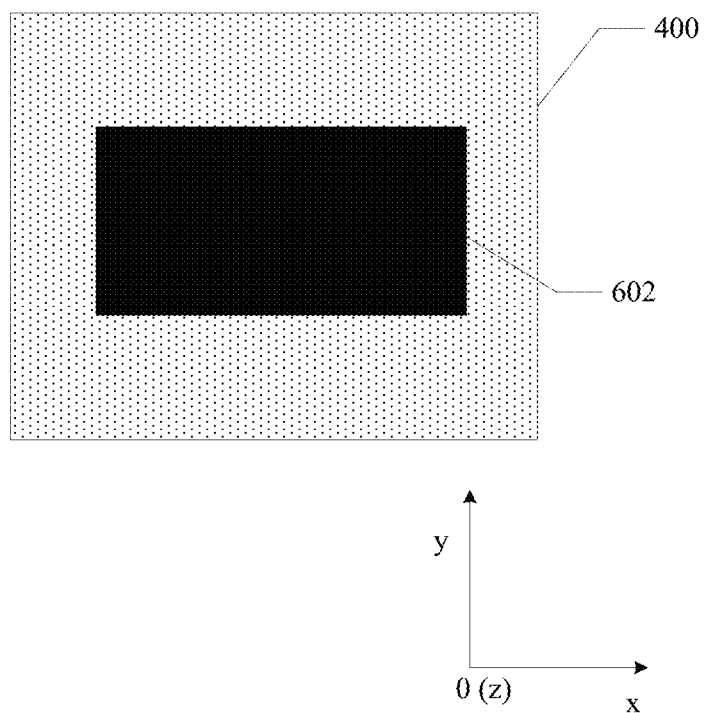
FIG. 12b is a top view of a packaged module according to an embodiment.

In an example, as a cross-sectional view of the packaged module shown in FIG. 12*a*, a top view corresponding to FIG. 12*a* may be shown in FIG. 12*b*. It may be understood with reference to FIG. 12*a* and FIG. 12*b* that the packaged module includes a metal frame 100, a metal strip 200, a circuit element 300, a magnetic material 400, and a heat dissipation plate 600. The heat dissipation plate 600 includes a supporting part 601 and a stacking part 602. One side of the supporting part 601 is coupled to the metal strip 200. The supporting part 601 my support the stacking part 602, so that a distance between the stacking part 602 and the metal frame 100 is greater than a distance between the stacking part 202 and the metal frame 100.

Figure 12C:
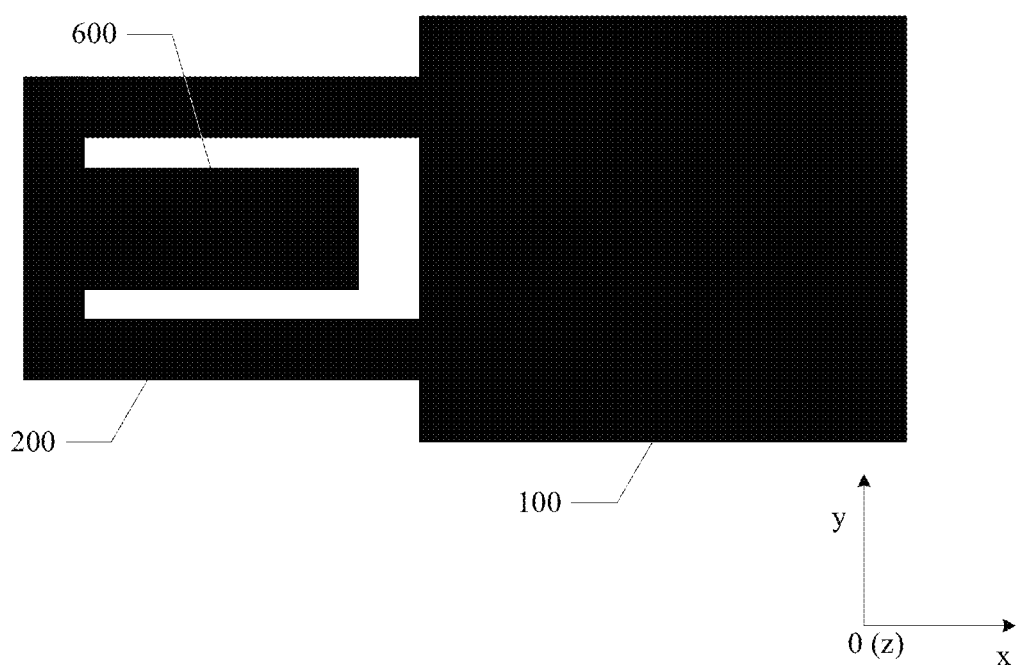
FIG. 12c is a schematic structural diagram of a metal plate according to an embodiment.

The packaged module shown in FIG. 12*a* may be obtained through packaging based on a metal plate shown in FIG. 12*c*. As shown in FIG. 12*c*, the metal plate includes a metal strip 200, a metal frame 100, and a heat dissipation plate 600, the metal strip 200 is a bending structure, and two ends of the metal strip 200 are integrally formed with a side of the metal frame 100. A side of the heat dissipation plate 600 and the side of the metal strip 200 are integrally formed.

The packaged module shown in FIG. 12*a* may be obtained by performing the following main steps based on the metal plate shown in FIG. 12*c*.

Step 1201: Assemble a circuit element 300 on a first surface of the metal frame 100.

Figure 12D:
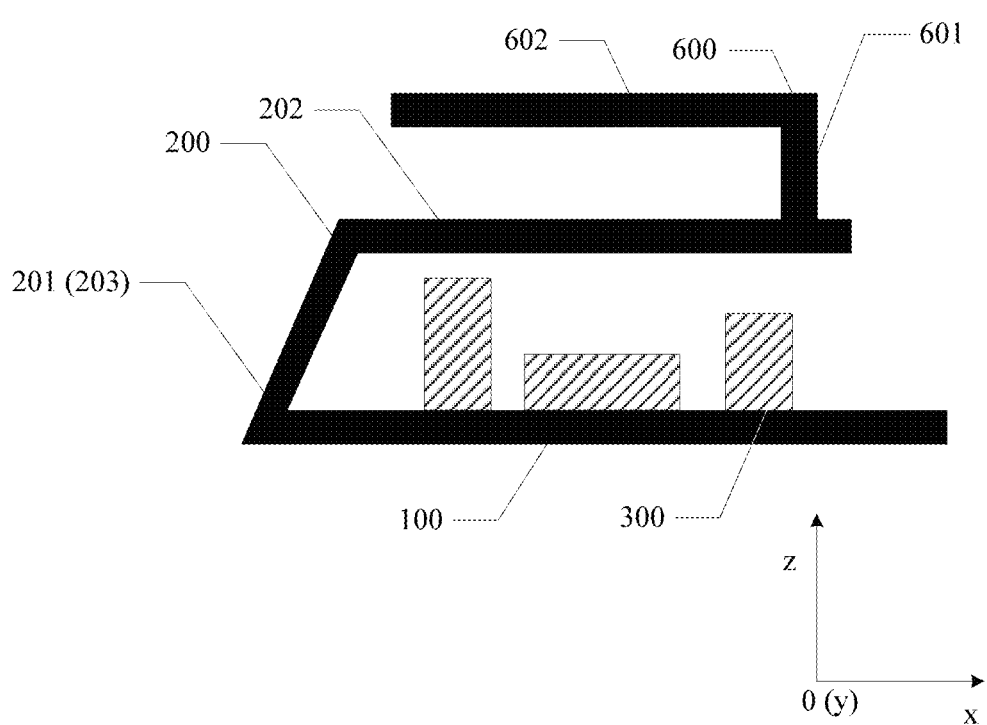
FIG. 12d is a schematic diagram of an intermediate structure according to an embodiment.
Figure 12E:
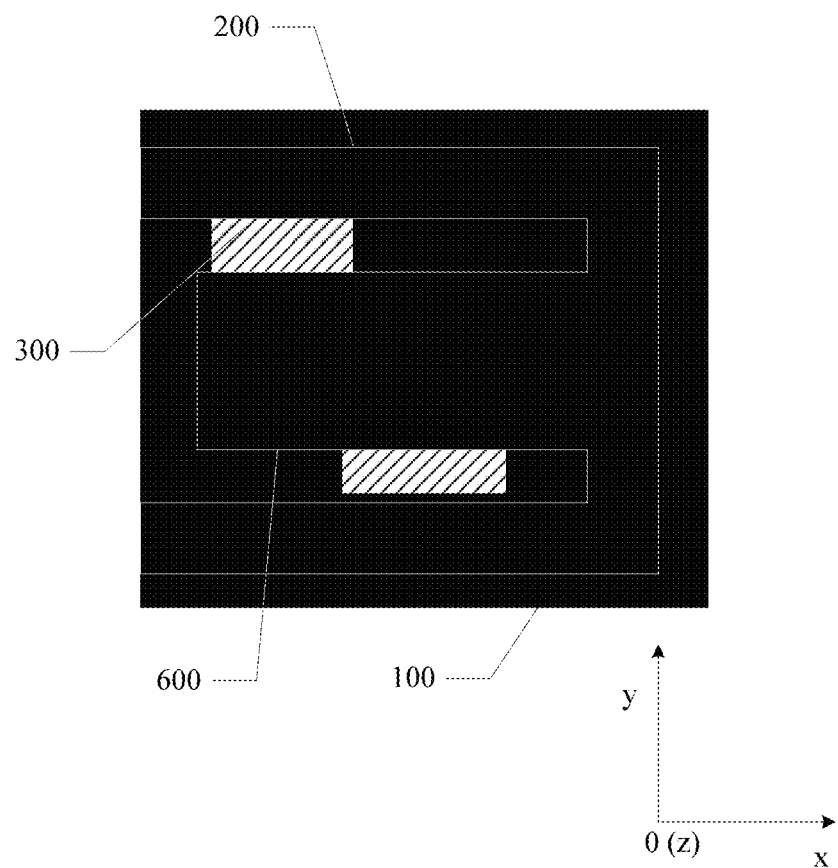
FIG. 12e is another schematic diagram of an intermediate structure according to an embodiment.

Step 1202: Fold the metal strip 200 and the heat dissipation plate 600 into bending structures to obtain an intermediate structure shown in FIG. 12*d*. FIG. 12*d* is a cross-sectional view of the intermediate structure, and a corresponding top view is shown in FIG. 12*e*. It may be understood with reference to FIG. 12*d* and FIG. 12*e* that the folded metal strip 200 includes a supporting part 201, a supporting part 203, and a stacking part 202 located between the supporting part 201 and the supporting part 203. The folded heat dissipation plate 600 also includes a supporting part 601 and a stacking part 602, and the supporting part 601 is coupled to a side of the stacking part 202, to support the stacking part 602 to a position higher than the stacking part 202.

Step 1203: Dispose a magnetic material on a surface of a winding functional region of the metal strip 200. In a possible implementation, the magnetic material may be used to package the intermediate structure shown in FIG. 12*d* to obtain the packaged module shown in FIG. 12*a*.

Figure 12F:
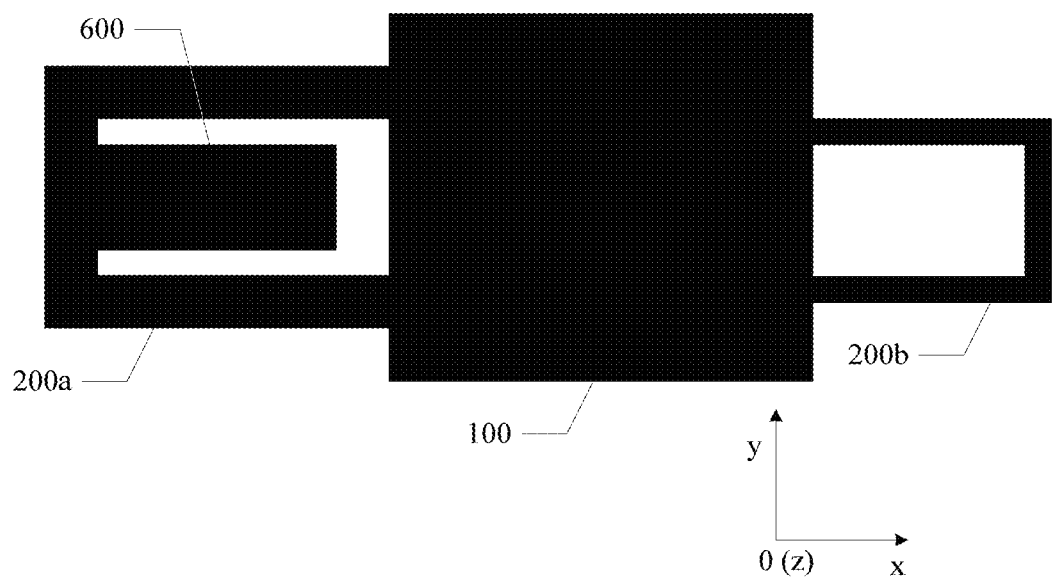
FIG. 12f is a schematic structural diagram of a metal plate according to an embodiment.
Figure 12G:
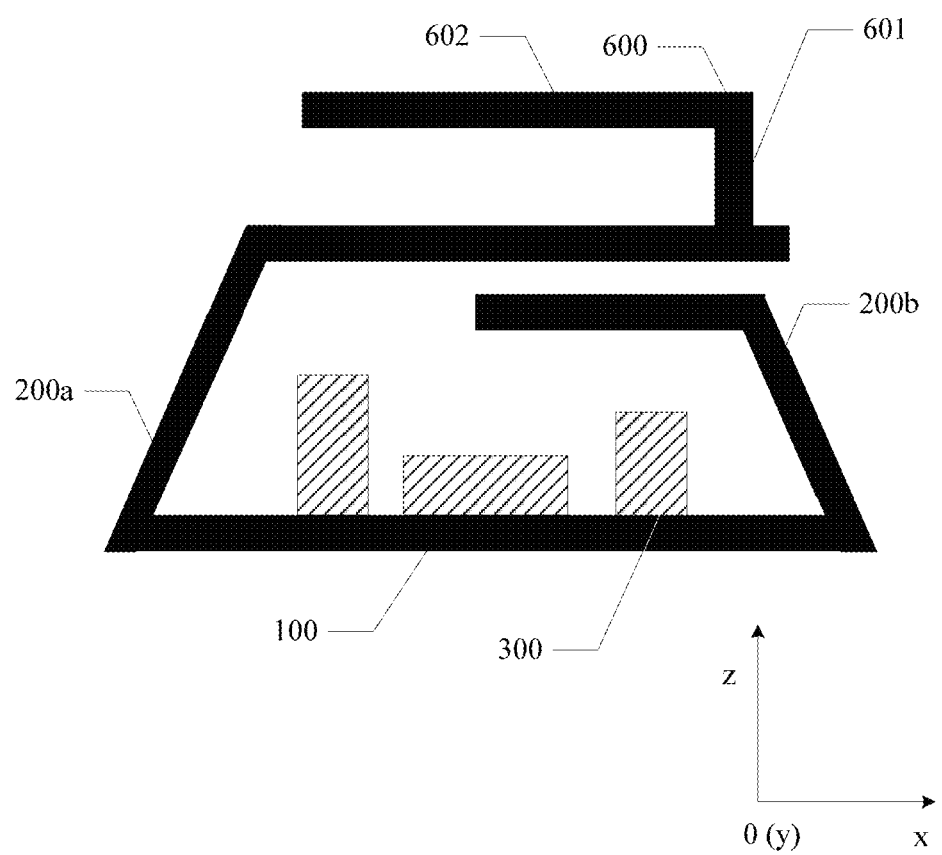
FIG. 12g is a schematic diagram of an intermediate structure according to an embodiment.

In a possible implementation, FIG. 12*a* may include at least two metal strips 200 (such as a metal strip 200*a* and a metal strip 200*b*). Two ends of the metal strip 200*a* are coupled to one side of the metal frame, and two ends of the metal strip 200*b* are coupled to the other side of the metal frame. For example, the metal plate shown in FIG. 12*f* may be used to obtain the foregoing packaged module. After the metal strip 200*a*, the metal strip 200*b*, and the heat dissipation plate 600 are folded in step 1202, the intermediate structure shown in FIG. 12*g* may be obtained, so as to improve the heat dissipation capability of the packaged module and implement functions of a plurality of inductors in the packaged module.

Figure 13A:
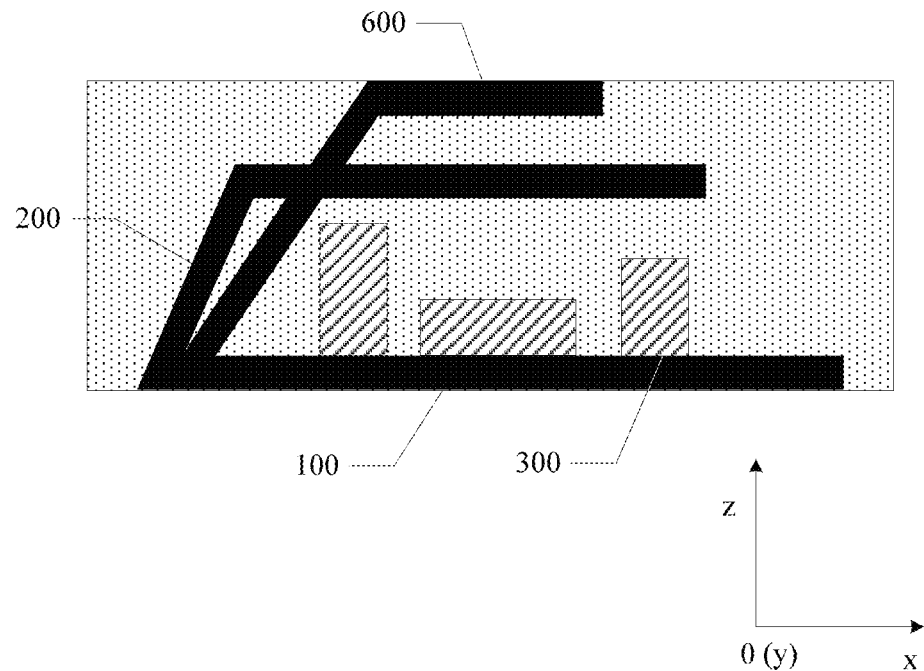
FIG. 13a is a cross-sectional view of a packaged module according to an embodiment.
Figure 13B:
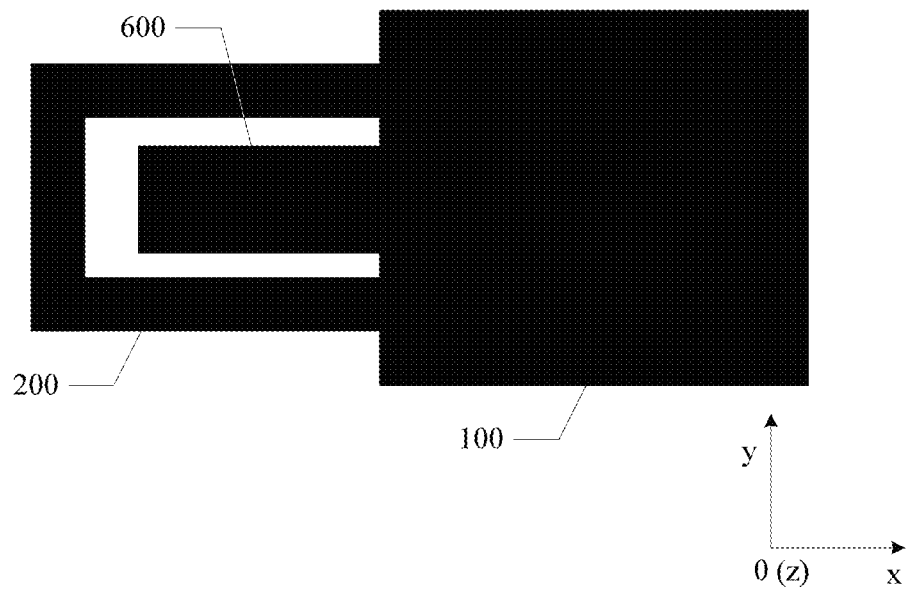
FIG. 13b is a schematic structural diagram of a metal plate according to an embodiment.
Figure 13C:
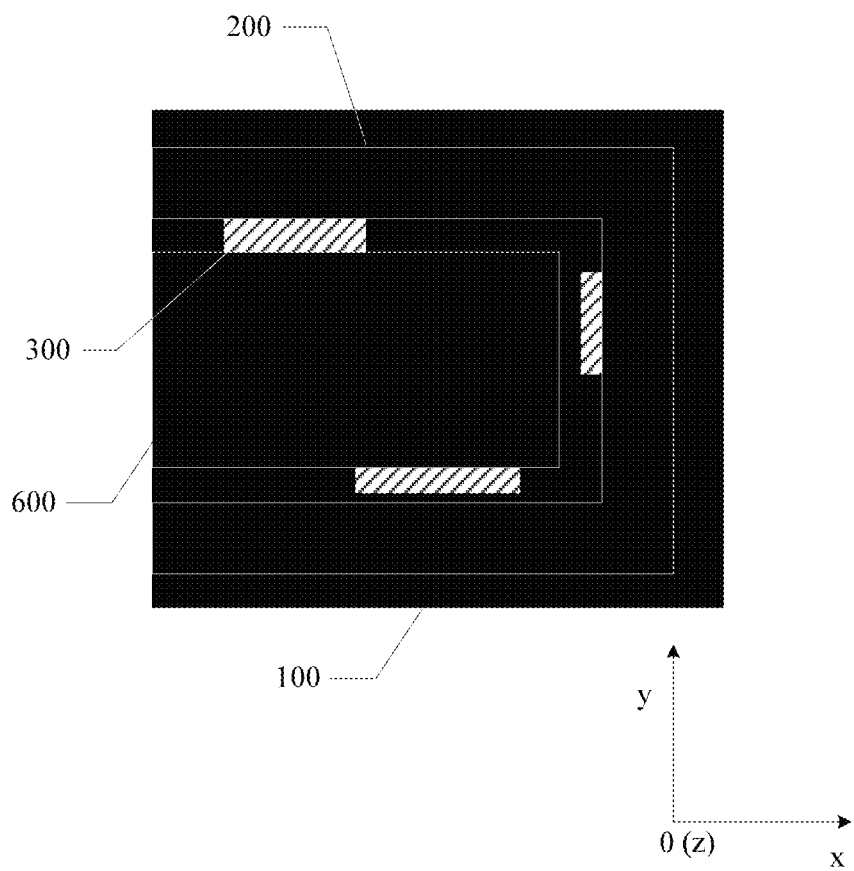
FIG. 13c is a schematic diagram of an intermediate structure according to an embodiment.

In another example, a side of the heat dissipation plate 600 may also be coupled to the side of the metal frame 100. For example, in the packaged module shown in FIG. 13*a*, two ends of the metal strip 200 and one side of the heat dissipation plate 600 are all coupled to one side of the metal frame 100, and the side at which the heat dissipation plate 600 is coupled to the metal frame 100 is located between the two ends of the metal strip 200. For example, a metal plate constituting the packaged module shown in FIG. 13*a* may be shown in FIG. 13*b*, and the metal plate includes a metal strip 200, a metal frame 100, and a heat dissipation plate 600. Two ends of the metal strip 200 and one side of the heat dissipation plate 600 are integrally formed with a side of the metal frame 100, and the side of the heat dissipation plate 600 is located between the two ends of the metal strip 200. The metal strip 200 and the heat dissipation plate 600 in FIG. 13*b* are folded into bending structures, to obtain an intermediate structure whose side view is similar to that in FIG. 9*d*. A difference lies in that the metal strip 200*b* becomes the heat dissipation plate 600. The top view of the obtained intermediate structure may be shown in FIG. 13*c*.

Figure 14A:
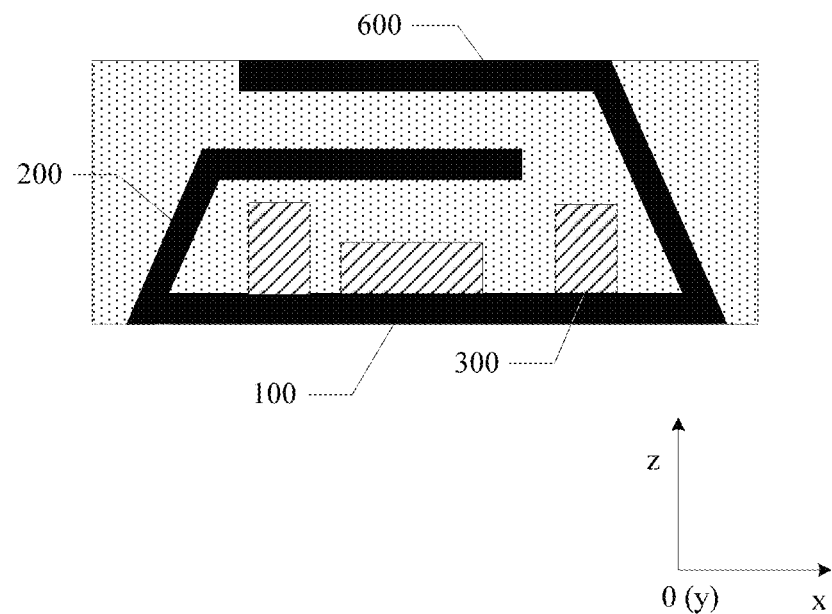
FIG. 14a is a cross-sectional view of a packaged module according to an embodiment.
Figure 14B:
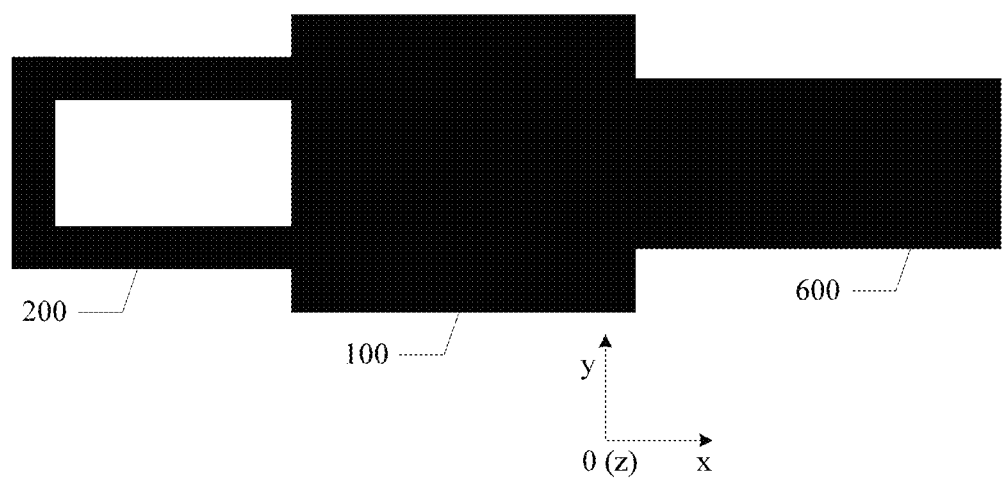
FIG. 14b is a schematic structural diagram of a metal plate according to an embodiment.
Figure 14C:
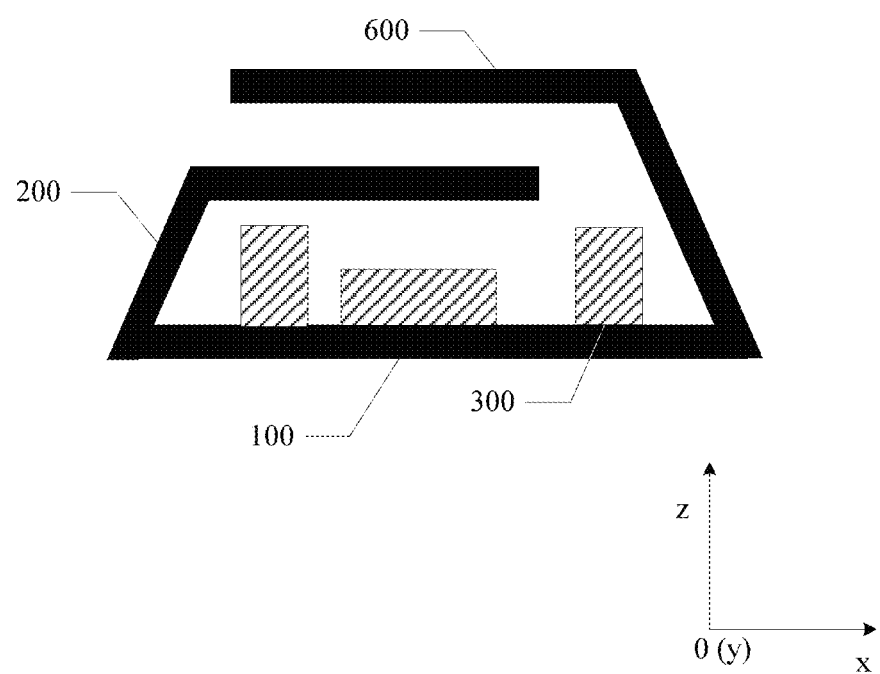
FIG. 14c is a schematic diagram of an intermediate structure according to an embodiment.
Figure 14D:
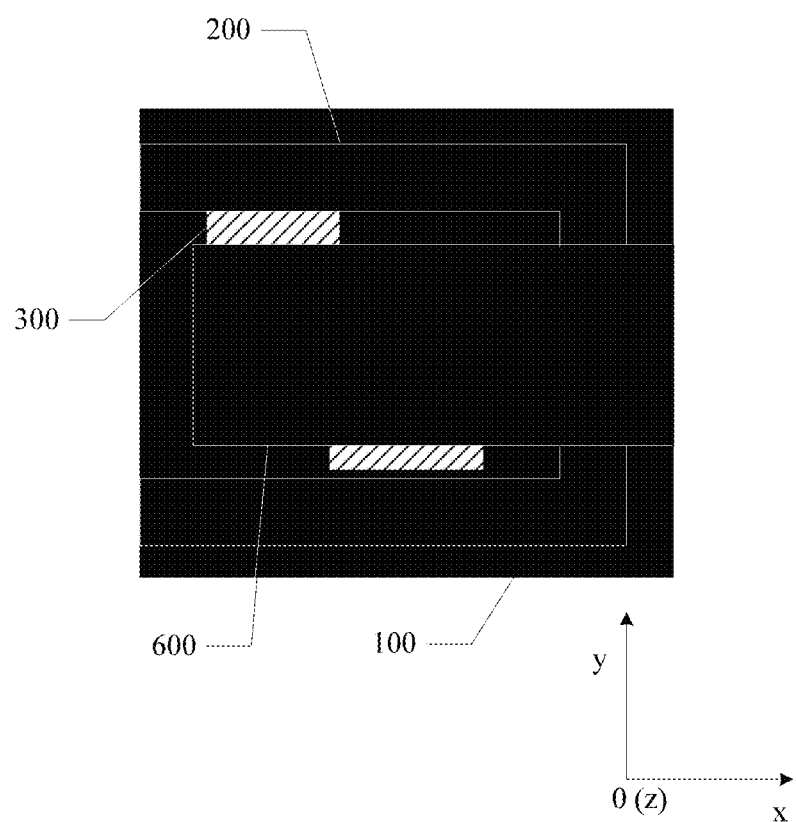
FIG. 14d is another schematic diagram of an intermediate structure according to an embodiment.

For another example, in a cross-sectional view of a packaged module shown in FIG. 14*a*, two ends of the metal strip 200 in the packaged module are coupled to one side of the metal frame 100, and one side of the heat dissipation plate 600 is coupled to the other side of the metal frame. For example, the packaged module shown in FIG. 14*a* may be obtained through packaging based on a metal plate shown in FIG. 14*b*. The metal plate shown in FIG. 14*b* includes a metal frame 100, a metal strip 200, and a heat dissipation plate 600. The metal strip 200 is a bending structure, two ends of the metal strip 200 are integrally formed with one side of the metal frame 100, and one side of the heat dissipation plate is integrally formed with the other side of the metal frame 100. An intermediate structure as shown in FIG. 14c may be obtained by folding the metal strip 200 and the heat dissipation plate 600 in FIG. 14b. FIG. 14c is a cross-sectional view of the intermediate structure, and a corresponding top view is shown in FIG. 14d.

Figure 15A:
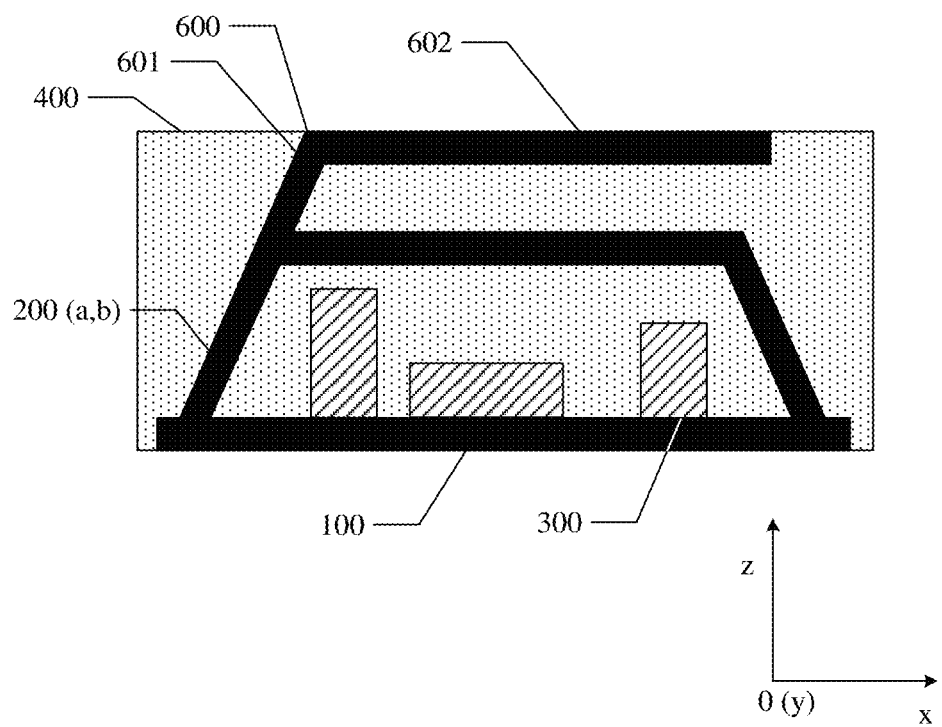
FIG. 15a is a cross-sectional view of a packaged module according to an embodiment.

In another example, in a side view of a packaged module shown in FIG. 15a, the packaged module may include a plurality of metal strips 200 (a metal strip 200a and a metal strip 200b). The metal strip 200a and the metal strip 200b are folded structures, and two ends of the metal strip 200a and two ends of the metal strip 200b are coupled to the first surface of the metal frame 100. The metal strip 200a and the metal strip 200b are disposed side by side on the first surface of the metal frame 100, and the heat dissipation plate 600 may also be disposed between the metal strip 200a and the metal strip 200b. The heat dissipation plate 600 is a bending structure and includes a supporting part 601 and a stacking part 602. One side of the supporting part 601 is fastened to the first surface of the metal frame 100 and supports the stacking part 602, so that a distance between the stacking part 602 and the metal frame 100 is greater than a distance between supporting parts of the metal strip 200a and the metal strip 200b and the metal frame 100.

Figure 15B:
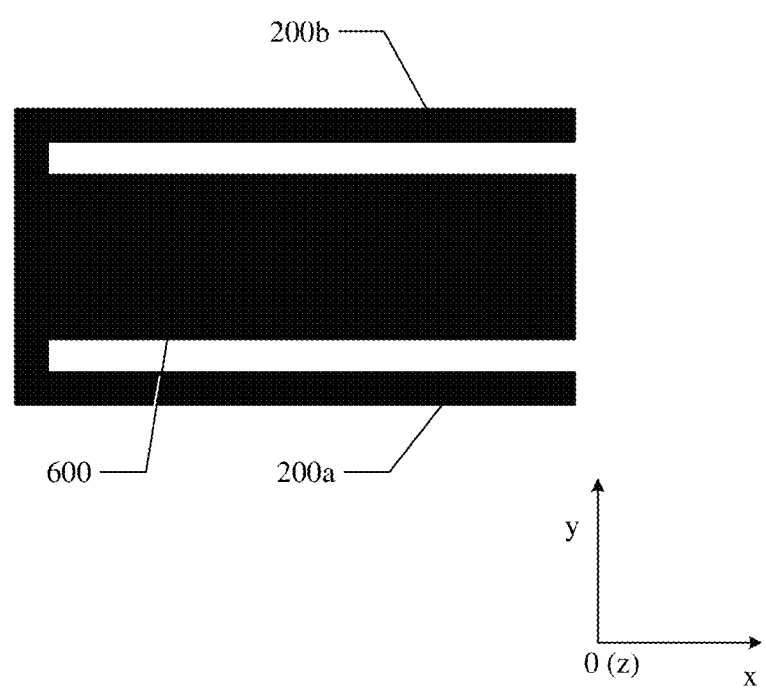
FIG. 15b is a schematic structural diagram of a metal plate according to an embodiment.

In a possible implementation, FIG. 15a may be obtained based on the metal plate shown in FIG. 15b. The metal plate shown in FIG. 15b includes a metal strip 200a, a metal strip 200b, and a heat dissipation plate 600. One side of the heat dissipation plate is integrally formed with one end of the metal strip 200a and one end of the metal strip 200b separately. In the process of packaging the packaged module shown in FIG. 15a, the metal strip 200a, the metal strip 200b, and the heat dissipation plate 600 may be first folded into bending structures; and the metal strip 200a, the metal strip 200b, and the heat dissipation plate 600 may be fastened together to the first surface of the metal frame 100, thereby helping simplify the packaging process.

Although the embodiments are described with reference to features and the embodiments thereof, various modifications and combinations may be made to them without departing from the spirit and scope of the embodiments. Correspondingly, the embodiments and accompanying drawings are merely example description of this application defined by the accompanying claims, and are considered as any of or all modifications, variations, combinations, or equivalents that cover the scope of the embodiments. A person of ordinary skill in the art can make various modifications and variations to the embodiments without departing from the spirit and scope. The embodiments cover these modifications and variations of the embodiments.

What is claimed is:

1. A packaged module, comprising: a bearing structure, at least one metal strip, a circuit element, a magnetic material, and a heat dissipation plate wherein
   a first surface of the bearing structure bears the circuit element;
   two ends of the at least one metal strip are coupled to the bearing structure and integrally formed with a side of the bearing structure, and a part of the at least one metal strip other than the two ends is spaced apart from the bearing structure; and
   the magnetic material covers a surface of a winding functional region of the at least one metal strip, wherein the winding functional region is a part or all of the metal strip to which the winding functional region belongs,
   wherein the heat dissipation plate includes a first supporting part and a first stacking part, one side of the first supporting part is coupled to the at least one metal strip, and the first supporting part supports the first stacking part, so that a distance between the first stacking part and the bearing structure is greater than a distance between a second stacking part of the at least one metal strip.

2. The packaged module according to claim 1, wherein the at least one metal strip comprises a first metal strip, the first metal strip is a bending structure, and the first metal strip comprises: a second supporting part and a third supporting part that are located at two ends of the first metal strip, and a second stacking part located between the second supporting part and the third supporting part; and
   the circuit element is located between the second stacking part and the first surface of the bearing structure.

3. The packaged module according to claim 2, wherein the second stacking part is parallel to the first surface of the bearing structure.

4. The packaged module according to claim 2, wherein a surface of the second stacking part is exposed to an outer surface of the packaged module.

5. The packaged module according to claim 1, wherein the at least one metal strip comprises a first metal strip, and two ends of the first metal strip are coupled to the first surface of the bearing structure, or sides of two ends of the first metal strip are coupled to the side of the bearing structure, or a side of one end of the first metal strip is coupled to the side of the bearing structure, and an other end of the first metal strip is coupled to the first surface of the bearing structure.

6. The packaged module according to claim 2, wherein the at least one metal strip further comprises a second metal strip, wherein
   the two ends of the first metal strip and two ends of the second metal strip are all coupled to a same side of the bearing structure; and
   the two ends of the second metal strip are located between the two ends of the first metal strip.

7. The packaged module according to claim 5, wherein the at least one metal strip further comprises a third metal strip, wherein
   the two ends of the first metal strip are coupled to a first side of the bearing structure; and
   two ends of the third metal strip are coupled to a second side of the bearing structure.

8. The packaged module according to claim 2, wherein the two ends of the first metal strip and one side of the third supporting part are coupled to a same side of the bearing structure; and
   one side of the third supporting part is located between the two ends of the first metal strip.

9. The packaged module according to claim 1, wherein the packaged module is filled with the magnetic material, and at least one outer surface of the packaged module comprises the magnetic material.

10. The packaged module according to claim 9, wherein the magnetic material fills space inside the packaged module except the at least one metal strip and the circuit element; or
   the packaged module further comprises a plastic packaging material, wherein the plastic packaging material covers the circuit element, and the magnetic material fills other space in the packaged module.

11. A metal plate configured to bear a circuit element in a packaged module, the metal plate comprises at least one metal strip and a metal frame, wherein
> two ends of the at least one metal strip are coupled to a side of the metal frame wherein at least one end of the at least one metal strip is integrally formed with the side of the metal frame, and the at least one metal strip is configured to couple to a magnetic material in the packaged module,
> wherein the metal plate further comprises a heat dissipation plate, wherein
> one side of the heat dissipation plate is coupled to the side of the metal frame or a side of the at least one metal strip.

12. The metal plate according to claim 11, wherein the at least one metal strip comprises a first metal strip, and two ends of the first metal strip are coupled to the side of the metal frame.

13. The metal plate according to claim 12, wherein the at least one metal strip further comprises a second metal strip, wherein
> the two ends of the first metal strip and two ends of the second metal strip are all coupled to a same side of a bearing structure; and
> the two ends of the second metal strip are located between the two ends of the first metal strip.

14. The metal plate according to claim 13, wherein the at least one metal strip further comprises a third metal strip, wherein
> the two ends of the first metal strip are coupled to a first side of the bearing structure; and
> two ends of the third metal strip are coupled to a second side of the bearing structure.

15. The metal plate according to claim 11, wherein the two ends of the at least one metal strip and one side of the heat dissipation plate are coupled to a same side of a bearing structure; and
> a side of a supporting part coupled to the metal frame is located between the two ends of the metal strip.

* * * * *